(12) United States Patent
Nanjo et al.

(10) Patent No.: US 11,282,950 B2
(45) Date of Patent: Mar. 22, 2022

(54) METHOD FOR MANUFACTURING SEMICONDUCTOR DEVICE

(71) Applicant: Mitsubishi Electric Corporation, Tokyo (JP)

(72) Inventors: Takuma Nanjo, Tokyo (JP); Tetsuro Hayashida, Tokyo (JP); Koji Yoshitsugu, Tokyo (JP); Akihiko Furukawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 17 days.

(21) Appl. No.: 16/495,832

(22) PCT Filed: May 31, 2017

(86) PCT No.: PCT/JP2017/020240
§ 371 (c)(1),
(2) Date: Sep. 20, 2019

(87) PCT Pub. No.: WO2018/220741
PCT Pub. Date: Dec. 6, 2018

(65) Prior Publication Data
US 2020/0135908 A1    Apr. 30, 2020

(51) Int. Cl.
*H01L 29/778* (2006.01)
*H01L 29/20* (2006.01)
*H01L 29/812* (2006.01)

(52) U.S. Cl.
CPC ...... *H01L 29/7783* (2013.01); *H01L 29/2003* (2013.01); *H01L 29/812* (2013.01)

(58) Field of Classification Search
CPC ......... H01L 29/66462; H01L 21/28264; H01L 29/0847; H01L 21/3245; H01L 29/2003;
(Continued)

(56) References Cited

U.S. PATENT DOCUMENTS 6,140,169 A * 10/2000 Kawai .................... H01L 29/78
                                                    438/197
6,617,653 B1 * 9/2003 Yokogawa .......... H01L 29/7813
                                                    257/379
(Continued)

FOREIGN PATENT DOCUMENTS

JP    2008-305816 A    12/2008

OTHER PUBLICATIONS

International Search Report and Written Opinion dated Jul. 11, 2017 for PCT/JP2017/020240 filed on May 31, 2017, 8 pages including English Translation of the International Search Report.

*Primary Examiner* — Mouloucoulaye Inoussa
(74) *Attorney, Agent, or Firm* — Xsensus LLP

(57) ABSTRACT

Provided is a technology for obtaining a drain current of a sufficient magnitude in a field effect transistor using a nitride semiconductor. A channel layer that is $Al_{x1}In_{y1}Ga_{1-x1-y1}N$ is formed on an upper surface of a semiconductor substrate, and on an upper surface of the channel layer, a barrier layer that is $Al_{x2}In_{y2}Ga_{1-x2-y2}N$ having a band gap larger than that of the channel layer is formed. Then, on an upper surface of the barrier layer, a gate insulating film that is an insulator or a semiconductor and has a band gap larger than that of the barrier layer is at least partially formed, and a gate electrode is formed on an upper surface of the gate insulating film. Then, heat treatment is performed while a positive voltage is applied to the gate electrode.

17 Claims, 16 Drawing Sheets

(58) Field of Classification Search
CPC .............. H01L 29/7783; H01L 29/812; H01L 29/7786; H01L 29/518; H01L 29/78; H01L 29/66522; H01L 21/28587; H01L 21/2581; H01L 29/475; H01L 29/66856; H01L 29/66863; H01L 33/32; H01L 29/66431; H01L 29/1066; H01L 29/4175; H01L 29/42316
USPC ....... 257/192, 194, 195, 410, 411, 449, 453, 257/473, 766, 768, 368; 438/602, 604, 438/605, 172
See application file for complete search history.

(56) References Cited

U.S. PATENT DOCUMENTS

| | | | | |
|---|---|---|---|---|
| 6,774,449 | B1* | 8/2004 | Nishii | H01L 21/28581 257/449 |
| 2001/0023964 | A1* | 9/2001 | Wu | H01L 29/66863 257/368 |
| 2006/0273347 | A1* | 12/2006 | Hikita | H01L 29/66462 257/192 |
| 2007/0278518 | A1* | 12/2007 | Chen | H01L 29/7787 257/192 |
| 2007/0278521 | A1* | 12/2007 | Ishida | H01L 29/432 257/192 |
| 2009/0057720 | A1* | 3/2009 | Kaneko | H01L 29/432 257/194 |
| 2009/0242938 | A1* | 10/2009 | Niiyama | H01L 29/2003 257/194 |
| 2010/0084687 | A1* | 4/2010 | Chen | H01L 29/66462 257/194 |
| 2011/0316047 | A1* | 12/2011 | Nanjo | H01L 29/66462 257/192 |
| 2012/0126290 | A1* | 5/2012 | Uemoto | H01L 29/4175 257/192 |
| 2013/0277766 | A1* | 10/2013 | Kelwing | H01L 21/28185 257/411 |
| 2015/0255547 | A1* | 9/2015 | Yuan | H01L 27/0629 257/76 |
| 2015/0311331 | A1* | 10/2015 | Yamada | H01L 29/66462 257/76 |
| 2018/0308968 | A1* | 10/2018 | Miura | H01L 29/41758 |
| 2019/0385859 | A1* | 12/2019 | Nose | H01L 29/2003 |

* cited by examiner

F I G . 3
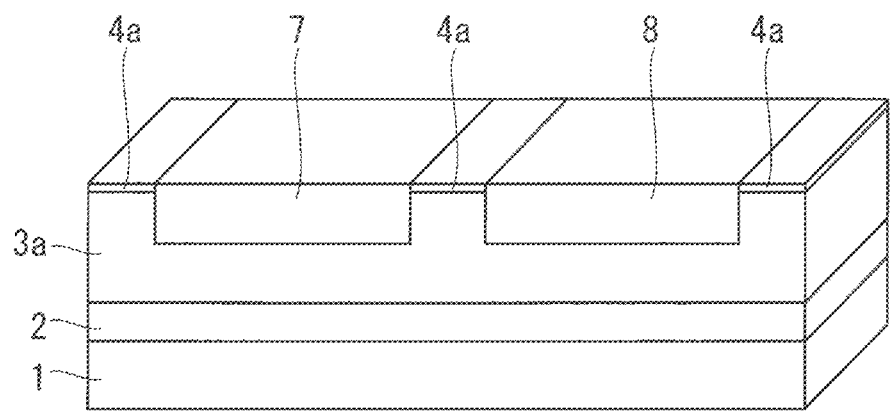
F I G . 4
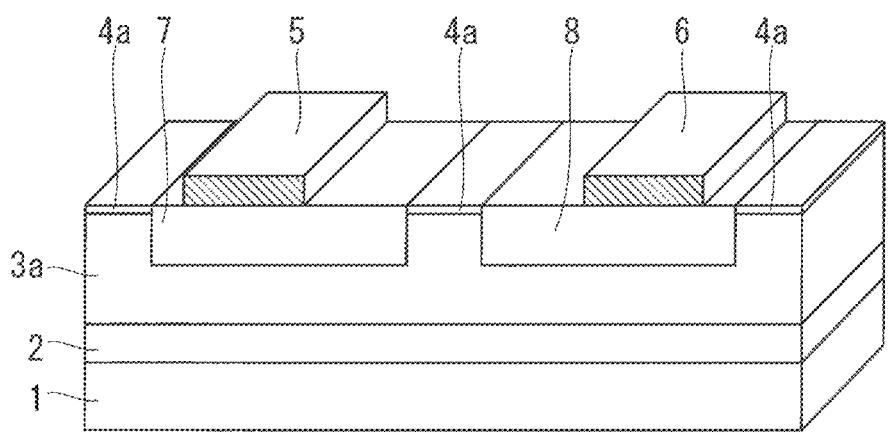

F I G. 5
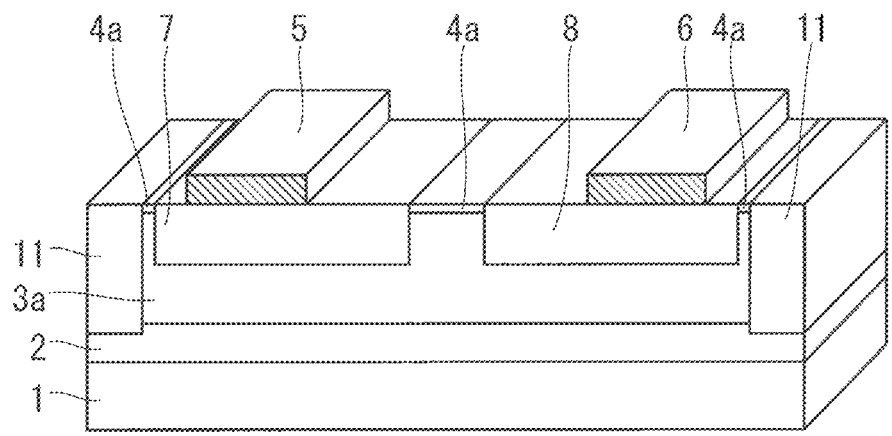
F I G. 6
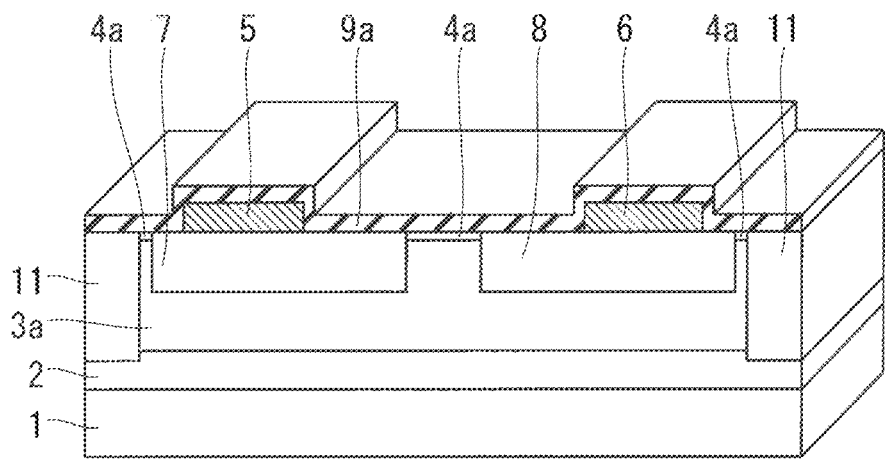

F I G. 7
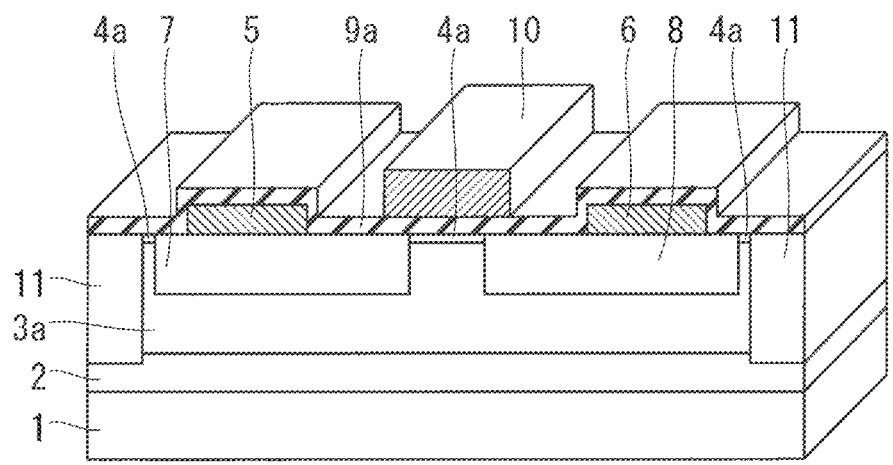
F I G. 8
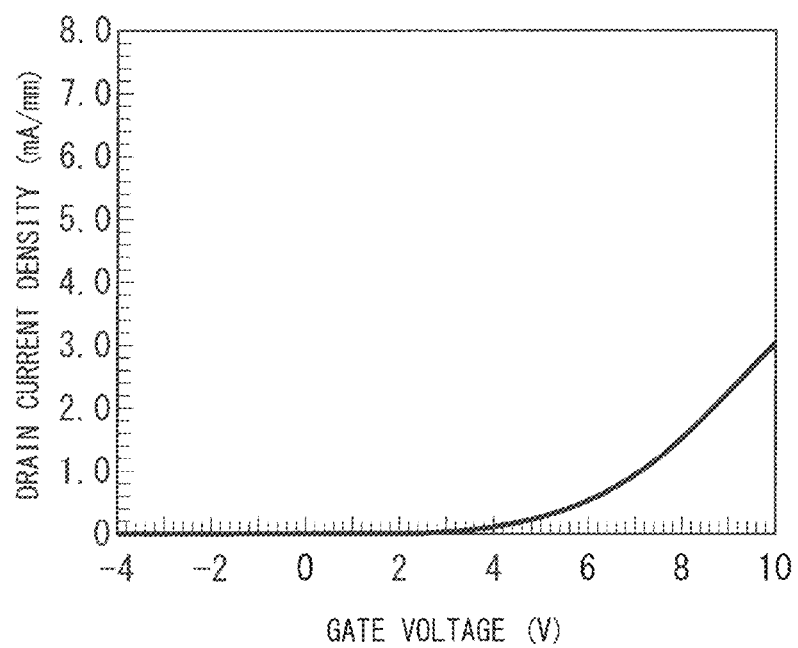

F I G . 9
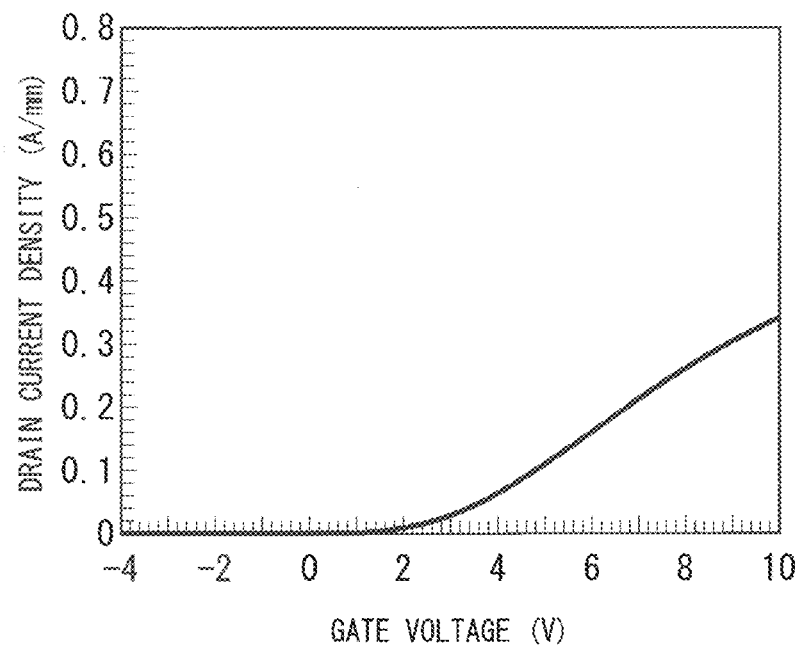
F I G . 1 0
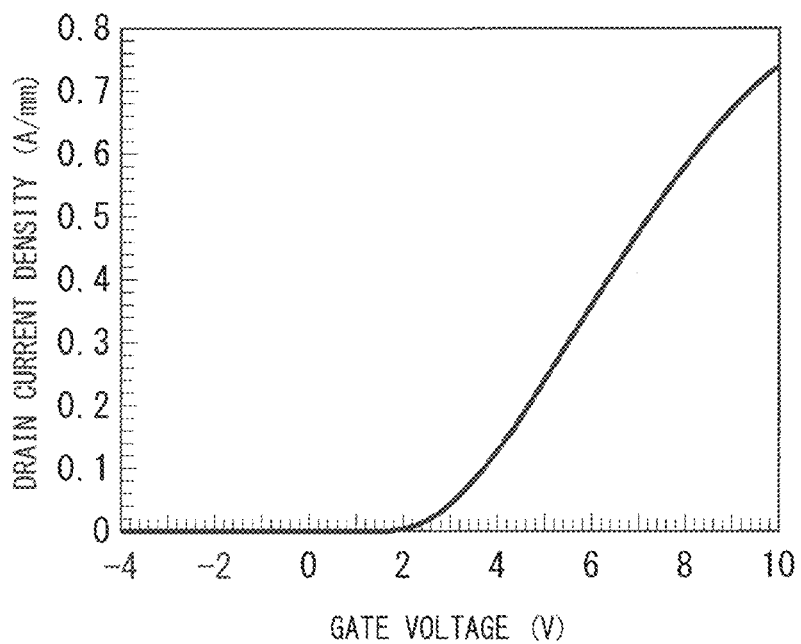

F I G . 1 1
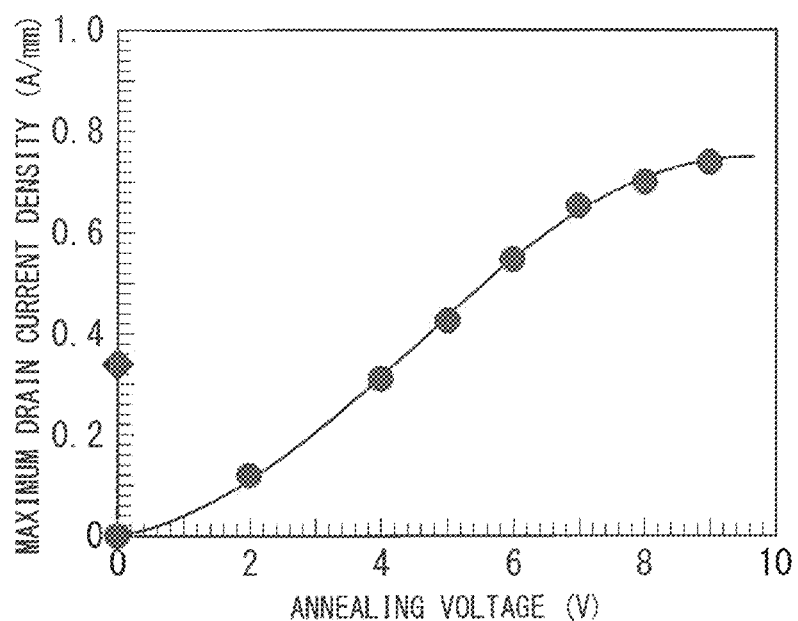
F I G . 1 2
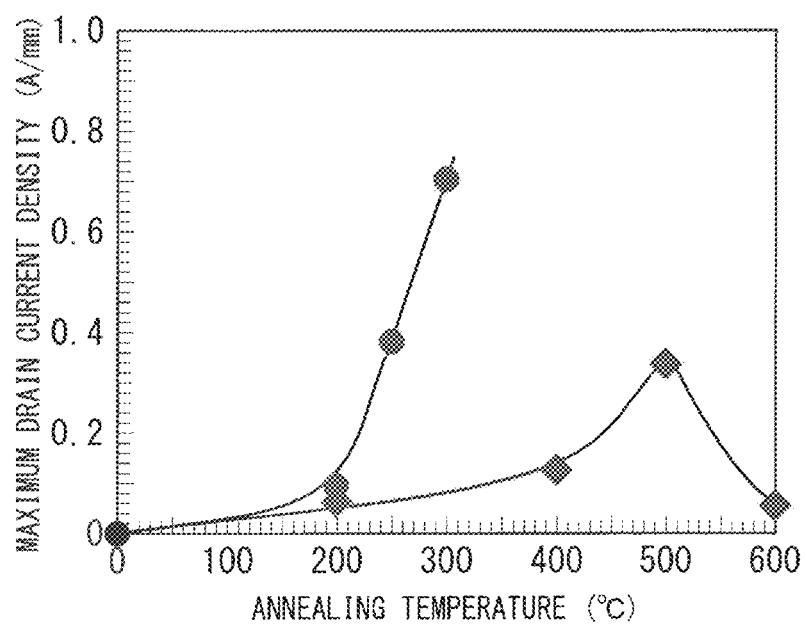

F I G. 1 3
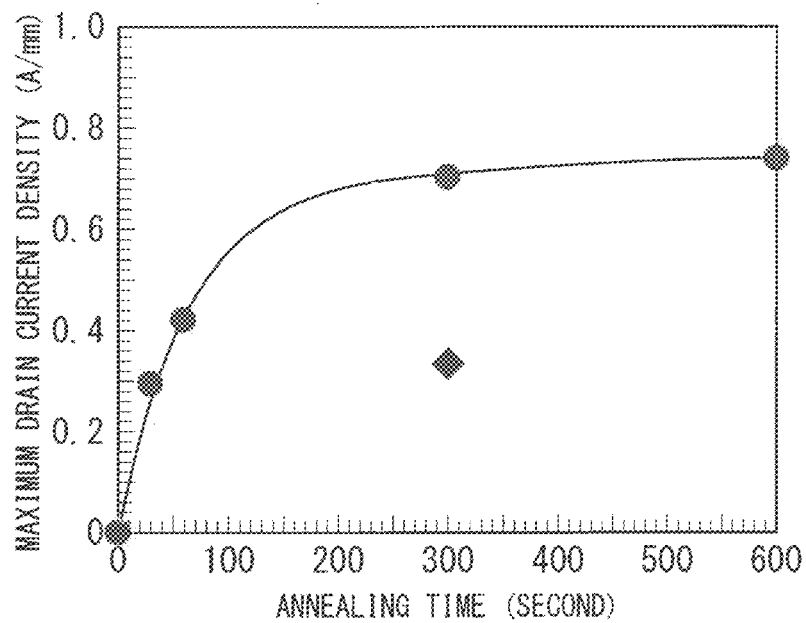
F I G. 1 4
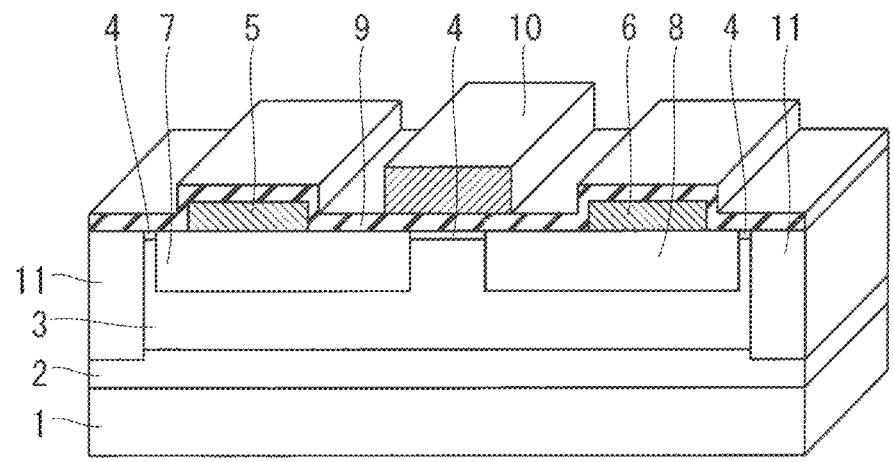

F I G . 1 5
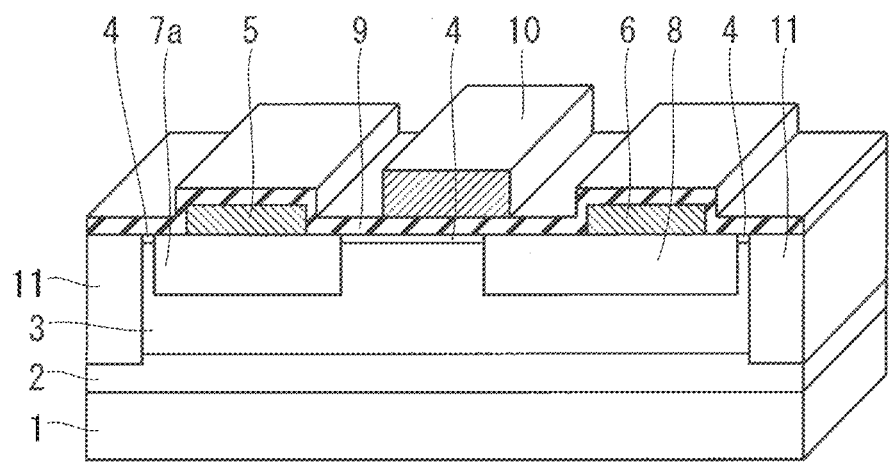
F I G . 1 6
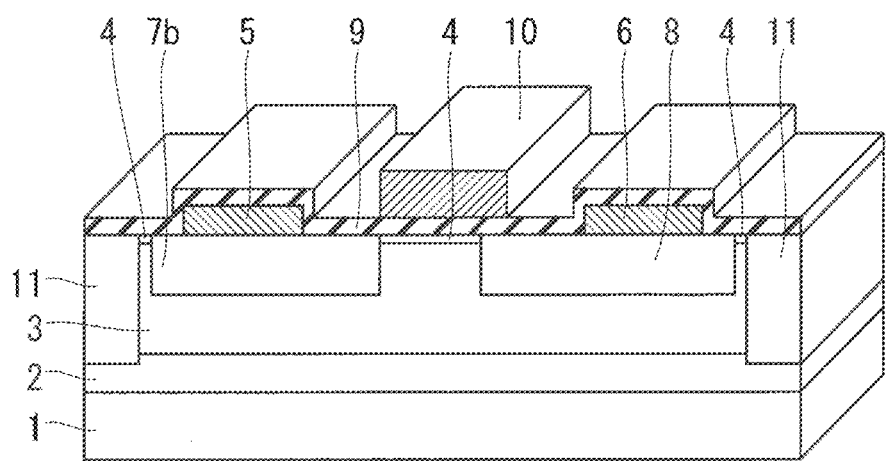

F I G . 1 7
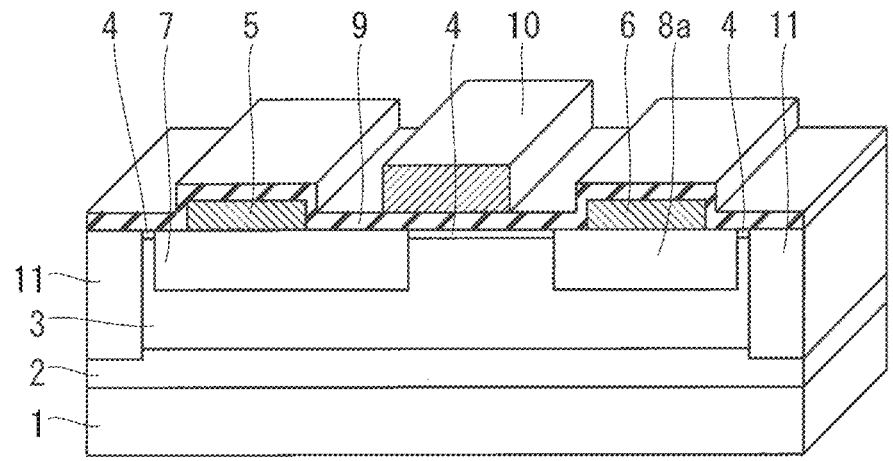
F I G . 1 8
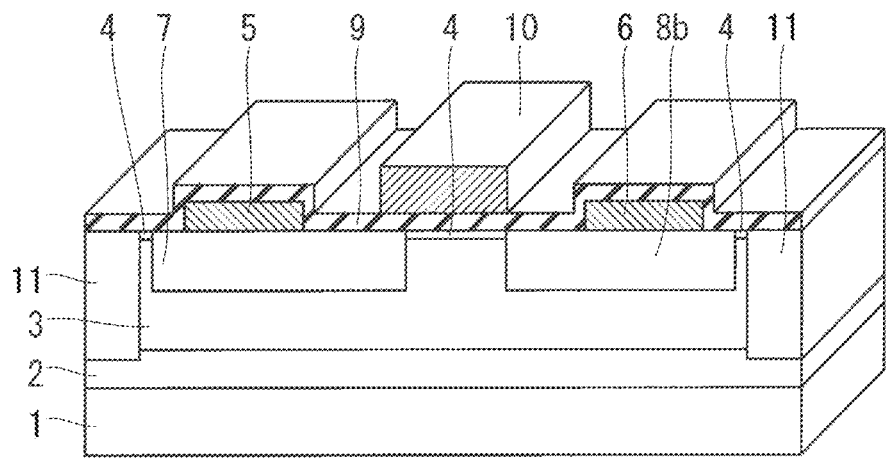

F I G . 2 1
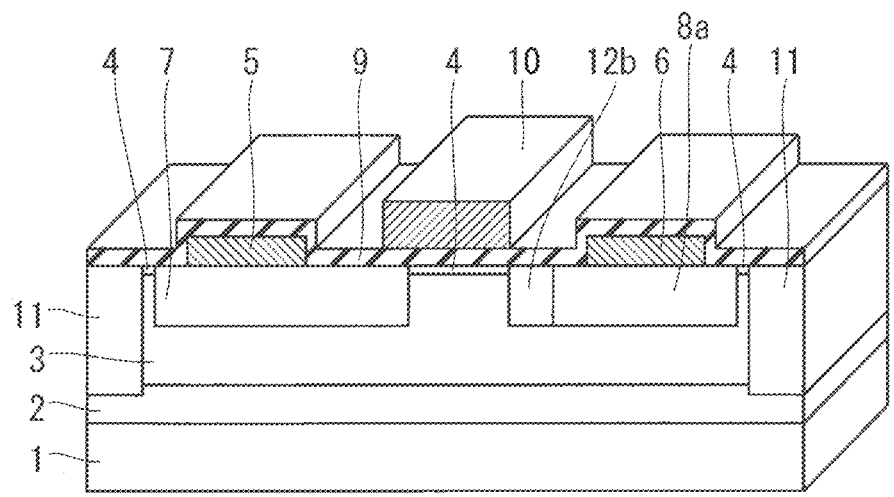
F I G . 2 2
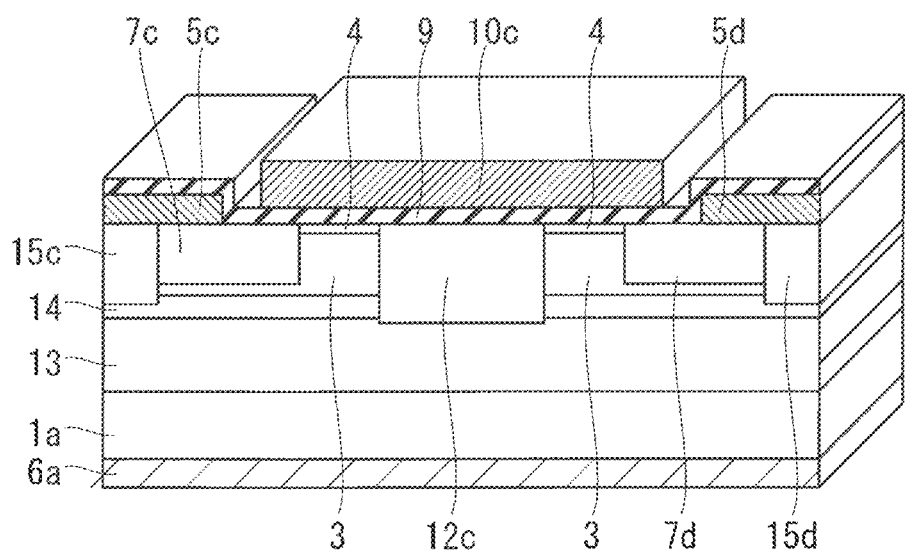

F I G. 29
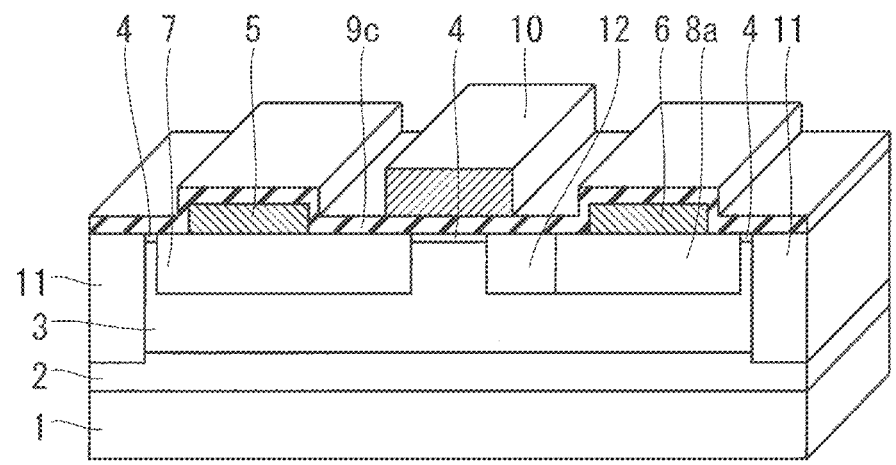
F I G. 30
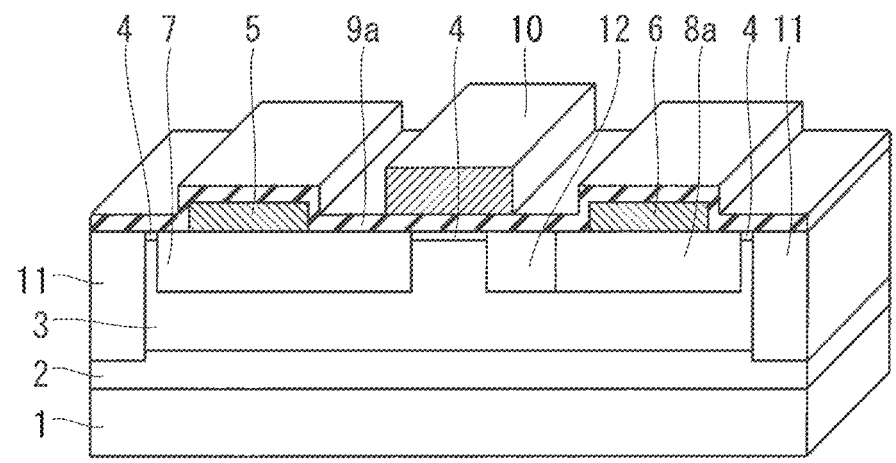

F I G . 3 1
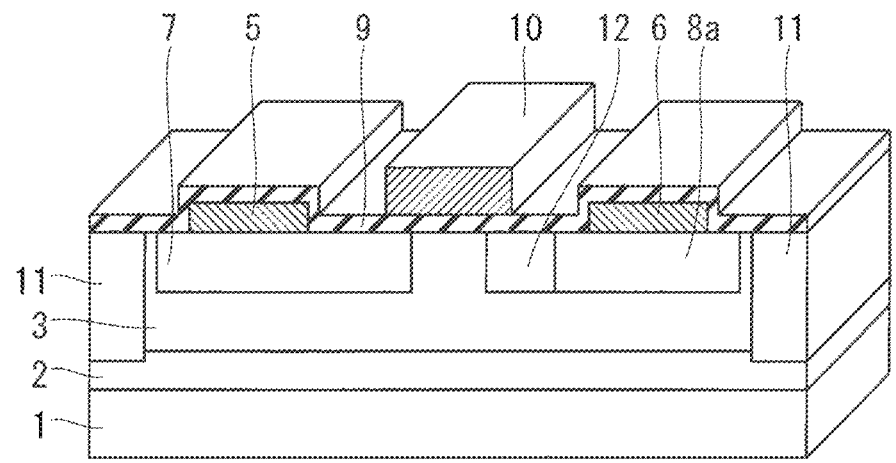
F I G . 3 2
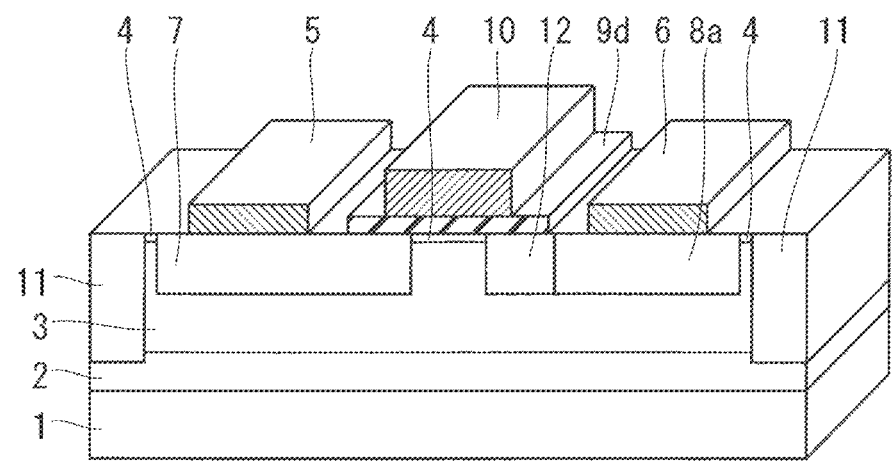

METHOD FOR MANUFACTURING SEMICONDUCTOR DEVICE

CROSS-REFERENCE TO RELATED APPLICATIONS

The present application is based on PCT filing PCT/JP2017/020240, filed May 31, 2017, the entire contents of which are incorporated herein by reference.

TECHNICAL FIELD

A technology disclosed in this specification relates to, for example, a field effect transistor using a semiconductor containing nitride.

BACKGROUND ART

In a field effect transistor using a semiconductor containing nitride, a GaN channel layer and an AlGaN barrier layer are sequentially formed on an upper surface of a semiconductor substrate. Then, further on an upper surface of the AlGaN barrier layer, a source electrode, a drain electrode, and a gate electrode are individually formed.

In addition, in the channel layer and the AlGaN barrier layer both located below the source electrode and the drain electrode, high-concentration n-type impurity regions are individually formed. On an upper surface of the AlGaN barrier layer that is sandwiched between these impurity regions and is not formed with the high-concentration n-type impurity region, a gate insulating film made of $AlGa_xO_y$ is formed so as to cover this region. Further, on an upper surface of this gate insulating film, a gate electrode is formed.

For example, a heterojunction field effect transistor made of a nitride semiconductor described in Patent Document 1 (Japanese Patent Application Laid-Open No. 2008-305816) has the above-described structure.

PRIOR ART DOCUMENT

Patent Document

Patent Document 1: Japanese Patent Application Laid-Open No. 2008-305816

SUMMARY

Problem to be Solved by the Invention

In a case of using a field effect transistor using a nitride semiconductor as a switching element or the like, a normally-off type is desirable in which a channel is not formed in a state of not being applied with a gate voltage.

Even in the structure exemplified in Patent Document 1, it is possible to obtain a sufficient drain current in a normally-off operation if it is possible to form an ideal interface where there is no interface trap at an interface between the gate insulating film made of $AlGa_xO_y$ or the like and the AlGaN barrier layer, while designing so as not to cause generation of two-dimensional electron gas at a heterointerface between the AlGaN barrier layer and the GaN channel layer that are located below the gate electrode, that is, such that energy at a lower end of a conduction band at the heterointerface between the channel layer and the AlGaN barrier layer below the gate electrode is to be higher than the Fermi energy.

However, as exemplified in Patent Document 1, in a case where a transistor is produced by a simple process of only depositing a gate insulating film on an upper surface of the AlGaN barrier layer, a high-concentration interface trap level is formed at an interface between the gate insulating film and the AlGaN barrier layer that is the semiconductor layer therebelow. This causes reduction of controllability of a drain current by a gate voltage, and a sufficient drain current cannot be obtained.

The technology disclosed in this specification has been made to solve the problem as described above, and it is an object to provide a technology for obtaining a sufficiently large drain current in a field effect transistor using a nitride semiconductor.

Means to Solve the Problem

In a first mode of the technology disclosed in this specification, a channel layer that is $Al_{x1}In_{y1}Ga_{1-x1-y1}N$ (where $0 \le x1 \le 1$, $0 \le y1 \le 1$) is formed on an upper surface of a semiconductor substrate, a barrier layer that is $Al_{x2}In_{y2}Ga_{1-x2-y2}N$ (where $0 \le x2 \le 1$, $0 \le y2 \le 1$) having a band gap larger than a band gap of the channel layer is formed on an upper surface of the channel layer, a gate insulating film that is an insulator or a semiconductor and has a larger band gap than that of the barrier layer is at least partially formed on an upper surface of the barrier layer, a gate electrode is formed on an upper surface of the gate insulating film, and heat treatment is performed while a positive voltage is being applied to the gate electrode.

In addition, in a second mode of the technology disclosed in this specification, a channel layer that is $Al_{x1}In_{y1}Ga_{1-x1-y1}N$ (where $0 \le x1 \le 1$, $0 \le y1 \le 1$) is formed on an upper surface of a semiconductor substrate, a gate insulating film that is an insulator or a semiconductor and has a larger band gap than a band gap of the channel layer is at least partially formed on an upper surface of the channel layer, a gate electrode is formed on an upper surface of the gate insulating film, and heat treatment is performed while a positive voltage is being applied to the gate electrode.

Effects of the Invention

In the first mode of the technology disclosed in this specification, the channel layer that is $Al_{x1}In_{y1}Ga_{1-x1-y1}N$ (where $0 \le x1 \le 1$, $0 \le y1 \le 1$) is formed on an upper surface of the semiconductor substrate, the barrier layer that is $Al_{x2}In_{y2}Ga_{1-x2-y2}N$ (where $0 \le x2 \le 1$, $0 \le y2 \le 1$) having a band gap larger than a band gap of the channel layer is formed on an upper surface of the channel layer, the gate insulating film that is an insulator or a semiconductor and has a larger band gap than that of the barrier layer is at least partially formed on an upper surface of the barrier layer, the gate electrode is formed on an upper surface of the gate insulating film, and heat treatment is performed while a positive voltage is being applied to the gate electrode. According to such a configuration, by performing the heat treatment while applying a positive voltage to the gate electrode, an interface trap level formed between the barrier layer and the gate insulating film is reduced. Therefore, a sufficiently large drain current can be obtained in a field effect transistor using a nitride semiconductor.

In addition, in the second mode of the technology disclosed in this specification, the channel layer that is $Al_{x1}In_{y1}Ga_{1-x1-y1}N$ (where $0 \le x1 \le 1$, $0 \le y1 \le 1$) is formed on an upper surface of the semiconductor substrate, the gate insulating film that is an insulator or a semiconductor and has a larger band gap than a band gap of the channel layer is at least partially formed on an upper surface of the channel layer, the gate electrode is formed on an upper surface of the gate insulating film, and heat treatment is performed while a positive voltage is being applied to the gate electrode. According to such a configuration, by performing the heat treatment while applying a positive voltage to the gate electrode, an interface trap level formed between the channel layer and the gate insulating film is reduced. Therefore, a sufficiently large drain current can be obtained in a field effect transistor using a nitride semiconductor.

Objects, features, aspects, and advantages of the technology disclosed in this specification will become more apparent from the detailed description given below and the accompanying drawings.

BRIEF DESCRIPTION OF DRAWINGS

FIG. 3 is a view illustrating the production process of the heterojunction field effect transistor using the nitride semiconductor, having the structure illustrated in FIG. 1.

FIG. 4 is a view illustrating the production process of the heterojunction field effect transistor using the nitride semiconductor, having the structure illustrated in FIG. 1.

FIG. 5 is a view illustrating the production process of the heterojunction field effect transistor using the nitride semiconductor, having the structure illustrated in FIG. 1.

FIG. 6 is a view illustrating the production process of the heterojunction field effect transistor using the nitride semiconductor, having the structure illustrated in FIG. 1.

FIG. 7 is a view illustrating the production process of the heterojunction field effect transistor using the nitride semiconductor, having the structure illustrated in FIG. 1.

FIG. 8 is a graph illustrating a drain current-gate voltage characteristic measured with a drain voltage of 5 V, in a heterojunction field effect transistor having a produced structure.

FIG. 9 is a graph illustrating a drain current-gate voltage characteristic measured with a drain voltage of 5 V, in a heterojunction field effect transistor having the structure illustrated in FIG. 1.

FIG. 10 is a graph illustrating a drain current-gate voltage characteristic measured with a drain voltage of 5 V, in a heterojunction field effect transistor having the structure illustrated in FIG. 1.

FIG. 11 is a graph illustrating annealing voltage dependency of a maximum drain current, in a transistor produced by performing bias annealing in air.

FIG. 12 is a graph illustrating annealing temperature dependency of a maximum drain current, in a transistor produced by performing bias annealing in air.

FIG. 13 is a graph illustrating annealing time dependency of a maximum drain current, in a transistor produced by performing bias annealing in air.

FIG. 14 is a view schematically illustrating a structure of a semiconductor device according to an embodiment.

FIG. 15 is a view schematically illustrating a structure of a semiconductor device according to an embodiment.

FIG. 16 is a view schematically illustrating a structure of a semiconductor device according to an embodiment.

FIG. 17 is a view schematically illustrating a structure of a semiconductor device according to an embodiment.

FIG. 18 is a view schematically illustrating a structure of a semiconductor device according to an embodiment.

FIG. 21 is a view schematically illustrating a structure of a semiconductor device according to an embodiment.

FIG. 22 is a view schematically illustrating a structure of a semiconductor device according to an embodiment.

FIG. 29 is a view schematically illustrating a structure of a semiconductor device according to an embodiment.

FIG. 30 is a view schematically illustrating a structure of a semiconductor device according to an embodiment.

FIG. 31 is a view schematically illustrating a structure of a semiconductor device according to an embodiment.

FIG. 32 is a view schematically illustrating a structure of a semiconductor device according to an embodiment.

DESCRIPTION OF EMBODIMENTS

Figure 1:
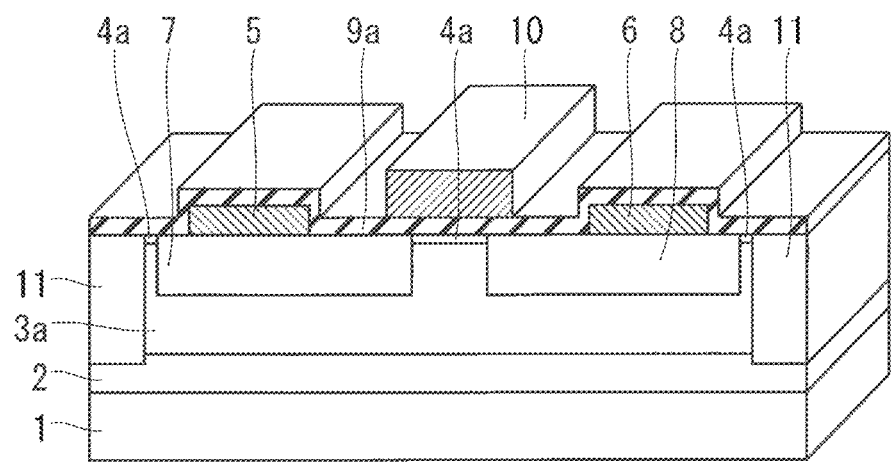
FIG. 1 is a view schematically illustrating a structure of a semiconductor device according to an embodiment.

Hereinafter, embodiments will be described with reference to the attached drawings.

Note that the drawings are schematically illustrated, and omission of a configuration or simplification of a configuration may be made as appropriate for the convenience of description. In addition, correlation of sizes and positions of configurations and the like individually shown in different drawings are not necessarily accurately described, but may be changed as appropriate.

Moreover, in the description shown below, similar components are given with same reference numerals to be illustrated, and names and functions thereof are also considered to be similar. Accordingly, detailed descriptions of those may be omitted to avoid redundancy.

Further, in the following description, even in a case where terms meaning a specific position and a direction, such as "upper", "lower", "left", "right", "side", "bottom", "front", or "back" are used, these terms are used for convenience to facilitate understanding of the contents of the embodiment, and have no relation to a direction of actual implementation.

Further, in the following description, even in a case where ordinal numbers such as "first" or "second" are used, these terms are used for convenience to facilitate understanding of the contents of the embodiment, without limiting to an order and the like that may occur by these ordinal numbers.

First Embodiment

Hereinafter, a semiconductor device and a method for manufacturing semiconductor device according to the present embodiment will be described.

<Regarding Configuration of Semiconductor Device>

FIG. 1 is a view schematically illustrating a structure of a semiconductor device according to the present embodiment. Specifically, FIG. 1 is a view schematically illustrating a structure of a heterojunction field effect transistor using a nitride semiconductor according to the present embodiment.

As illustrated in FIG. 1, the heterojunction field effect transistor includes a semiconductor substrate 1 in a bottom layer. Then, in the heterojunction field effect transistor, a channel layer 3a made of non-doped GaN is formed on an upper surface of the semiconductor substrate 1 via a buffer layer 2. Furthermore, in the heterojunction field effect transistor, on an upper surface of the channel layer 3a, there is formed a barrier layer 4a made of non-doped AlN, which forms a heterojunction with the channel layer 3a.

At a depth reaching inside the channel layer 3a from an upper surface of the barrier layer 4a, a high-concentration n-type impurity region 7 and a high-concentration n-type impurity region 8 are partially and individually formed. The n-type impurity region 7 and the n-type impurity region 8 contain Si at a high concentration.

Then, a source electrode 5 is formed on an upper surface of the n-type impurity region 7. In addition, a drain electrode 6 is formed on an upper surface of the n-type impurity region 8.

Further, at a depth reaching inside the buffer layer 2 from an upper surface of the barrier layer 4a, an element isolation region 11 is formed with an element region interposed therebetween.

Further, a gate insulating film 9a is formed to cover the element isolation region 11, the barrier layer 4a, the n-type impurity region 7, the source electrode 5, the n-type impurity region 8, and the drain electrode 6.

Then, on an upper surface of the gate insulating film 9a, a gate electrode 10 is formed at a position sandwiched between the source electrode 5 and the drain electrode 6 in plan view.

In the above-described structure, the gate insulating film 9a and the gate electrode 10 are formed to cover the entire upper surface of the barrier layer 4a sandwiched between the n-type impurity region 7 and the n-type impurity region 8 in plan view.

Further, in an equilibrium state, that is, in a state where no voltage is applied to the source electrode 5, the drain electrode 6, and the gate electrode 10, energy at a lower end of a conduction band of a heterointerface between the channel layer 3a located below the gate electrode 10 and the barrier layer 4a at that position is to be in a state of being higher than the Fermi energy.

In the structure illustrated in FIG. 1, for example, when a thickness of the barrier layer 4a made of non-doped AlN is 1 nm, energy at a lower end of the conduction band of the heterointerface between the channel layer 3a located below the gate electrode 10 and the barrier layer 4a at that position is in a state of being higher than the Fermi energy, in the above equilibrium state.

In the above-described structure, in a case of an ideal state where an interface trap level concentration at the interface between the barrier layer 4a and the gate insulating film 9a is low in a channel region, that is, in a region located below the gate electrode 10 and sandwiched between the n-type impurity region 7 and the n-type impurity region 8, a normally-off operation is realized by the condition as described above. As this interface trap level concentration is lower, controllability of a drain current by a gate voltage is more improved, and a larger drain current can be obtained.

Second Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Method for Manufacturing Semiconductor Device>

FIGS. 2 to 7 are views illustrating a production process of a heterojunction field effect transistor using a nitride semiconductor, having the structure illustrated in FIG. 1.

Figure 2:
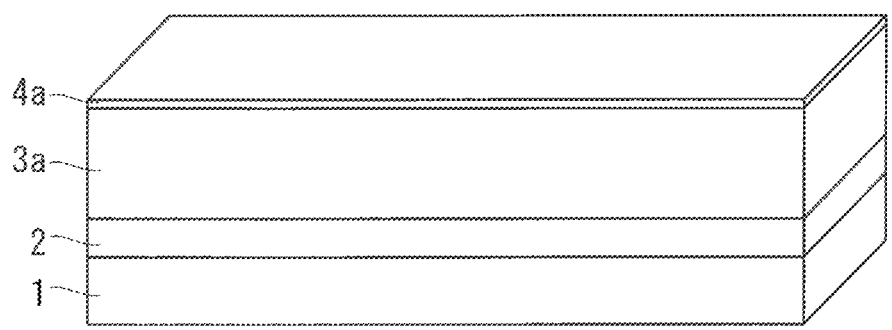
FIG. 2 is a view illustrating a production process of a heterojunction field effect transistor using a nitride semiconductor, having the structure illustrated in FIG. 1.

First, as illustrated in FIG. 2, a buffer layer 2, a channel layer 3a, and a barrier layer 4a each are grown sequentially from the bottom, by applying an epitaxial growth method such as a metal organic chemical vapor deposition (namely, MOCVD) method or a molecular beam epitaxy (namely, MBE) on a semiconductor substrate 1.

Next, as illustrated in FIG. 3, Si ions are implanted into a desired region by an ion implantation method with a resist pattern or the like as a mask. Conditions for the ion implantation are, for example, an implantation dose of $1 \times 10^{15}$ cm$^{-2}$ and implantation energy of 50 keV.

Thereafter, an n-type impurity region 7 and an n-type impurity region 8 are individually formed, for example, by performing heat treatment at a temperature of 1150° C. to activate the doped Si ions by using a rapid thermal annealing (namely, RTA) method.

Next, as illustrated in FIG. 4, a source electrode 5 and a drain electrode 6 made of a metal multilayer film are formed by vapor deposition and lift-off.

Next, as illustrated in FIG. 5, an element isolation region 11 reaching the buffer layer 2 is formed in the channel layer 3a and the barrier layer 4a located outside an element region where the transistor is produced, by using ion implantation method.

Next, as illustrated in FIG. 6, a gate insulating film 9a made of AlO$_a$ is deposited using an atomic layer deposition (namely, ALD) method with ozone as an oxygen supply source and trimethylaluminum as an Al supply source.

Next, as illustrated in FIG. 7, a gate electrode 10 made of a metal film is formed by vapor deposition and lift-off.

By the above method, the heterojunction field effect transistor having the structure illustrated in FIG. 1 can be produced. Note that, in the present embodiment, only minimal elements required to operate as a transistor have been described, but usage as a device is achieved through a formation process of a protective film, a field plate electrode, wiring, an air bridge, or a via hole, at the end.

FIG. 8 is a graph illustrating a drain current-gate voltage characteristic measured with a drain voltage of 5 V, in a heterojunction field effect transistor having a structure produced by the above method. In FIG. 8, a vertical axis represents a drain current density [mA/mm], and a horizontal axis represents a gate voltage [V]. Note that a produced element is a single finger type, a gate electrode width is 100 μm, and a channel length is 1 μm. Here, the channel length specifically refers to a distance between the n-type impurity region 7 and the n-type impurity region 8.

As illustrated in FIG. 8, in the transistor produced by the above production process, a normally-off type operation is performed, but the obtained drain current is 3 mA/mm, which is a very small value.

This seems to be because a high-concentration interface trap level is formed at an interface between the barrier layer 4a and the gate insulating film 9a in the channel region, and sufficiently high controllability of a drain current due to a gate voltage is not obtained.

FIG. 9 is a graph illustrating a drain current-gate voltage characteristic measured with a drain voltage of 5 V, in a heterojunction field effect transistor having the structure illustrated in FIG. 1. In FIG. 9, a vertical axis represents a drain current density [A/mm], and a horizontal axis represents a gate voltage [V]. Here, this heterojunction field effect transistor has been produced by performing a process of annealing (normal annealing: NA) by the RTA method after formation of the gate electrode 10 illustrated in FIG. 7.

The normal annealing process is performed under a condition of a temperature of 500° C. for five minutes in a nitrogen atmosphere. A width and a channel length of the gate electrode 10 are the same as in a case of the above-described transistor.

As illustrated in FIG. 9, a drain current of more than 300 mA/mm has been obtained by performing heat treatment at 500° C. after formation of the gate electrode 10. Note that, also in this case, the normally-off operation is performed.

As a cause of such an increase in the drain current, it can be mentioned that an interface trap level formed at the interface between the barrier layer 4a and the gate insulating film 9a in the channel region is reduced by the heat treatment. Assuming that the interface trap level is formed by dangling bonds of the interface, it can be explained that the heat treatment causes the dangling bonds to recombine, thereby reducing the interface trap level.

FIG. 10 is a graph illustrating a drain current-gate voltage characteristic measured with a drain voltage of 5 V, in a heterojunction field effect transistor having the structure illustrated in FIG. 1. In FIG. 10, a vertical axis represents a drain current density [A/mm], and a horizontal axis represents a gate voltage [V]. Here, this heterojunction field effect transistor has been produced by performing a process of annealing (bias annealing: BA) while applying a bias between the gate electrode and the source electrode, after formation of the gate electrode 10 illustrated in FIG. 7.

The bias annealing process is performed in air with a forward bias of +8 V being applied to the gate electrode 10, and is performed at an annealing temperature of 300° C. for 10 minutes. A width and a channel length of the gate electrode 10 of the transistor are the same as those of the above-described transistor.

As illustrated in FIG. 10, by performing bias annealing after formation of the gate electrode 10, a drain current has been further increased, and a sufficiently high current value of 700 mA/mm has been obtained. Note that, also in this case, the normally-off operation is performed.

A cause of the increase in the drain current can be explained by reduction in an interface trap level due to the heat treatment, similarly to the case of the normal annealing after formation of the gate electrode 10 described above. The reason why the increase in the drain current is larger in the case of performing the bias annealing than in the case of performing the normal annealing is considered to be because an amount of the reduced interface trap level is large.

By forming a forward bias on the gate electrode 10, an energy band structure of the barrier layer 4a and the gate insulating film 9a located below the gate electrode 10 is changed. It is considered that, as a result of the above, a reduction amount of the interface trap level has increased due to acceleration of dangling bond recombination.

In addition, a decrease in hydrogen contained in a bulk of the gate insulating film 9a by annealing in air is also considered as another cause.

In depositing the gate insulating film 9a, trimethylaluminum is used as a supply source of Al. Therefore, there is a possibility that hydrogen derived from a methyl group is mixed in the bulk of the gate insulating film 9a, and this hydrogen forms a trap level in the gate insulating film 9a.

Since air contains about 20% oxygen, it can be explained that during bias annealing a gettering action of hydrogen caused by this oxygen reduces hydrogen that forms a trap level, and the drain current has increased. Note that, by performing bias annealing in an atmosphere with an oxygen concentration higher than that in air, for example, in an atmosphere having an oxygen concentration of 20% or more, reduction of hydrogen that forms a trap level advances and the increase of the drain current is accelerated.

FIG. 11 is a graph illustrating annealing voltage dependency of a maximum drain current, in a transistor produced by performing bias annealing in air. In FIG. 11, a vertical axis represents a maximum drain current density [A/mm], and a horizontal axis represents an annealing voltage [V]. Further, FIG. 11 illustrates a maximum drain current density when a drain voltage is 5 V and a gate voltage is 10 V. This transistor is produced by performing bias annealing in air with an annealing temperature of 300° C., an annealing time of 300 seconds, and an annealing voltage of 0 V to +9 V. Note that the annealing voltage is a voltage applied to the gate electrode 10 in performing bias annealing.

Further, FIG. 11 also illustrates a maximum drain current in a transistor produced by performing normal annealing with an annealing temperature of 500° C. and an annealing time of 300 seconds in a nitrogen atmosphere. A maximum drain current density in a case where a drain voltage is 5 V and a gate voltage is 10 V is illustrated also for the transistor produced by performing the normal annealing. In FIG. 11, a maximum drain current density of the transistor produced by performing the bias annealing is indicated by a circle, and a maximum drain current density of the transistor produced by performing the normal annealing is indicated by a square. Note that a width and a channel length of the gate electrode 10 of the transistor are the same as those of the above-described transistor.

According to FIG. 11, it can be seen that when the bias annealing is performed by applying a voltage of +5 V or more to the gate electrode 10, a drain current higher than that of the normal annealing can be obtained.

FIG. 12 is a graph illustrating annealing temperature dependency of a maximum drain current, in a transistor produced by performing bias annealing in air. In FIG. 12, a vertical axis represents a maximum drain current density [A/mm], and a horizontal axis represents an annealing temperature [° C.]. Further, FIG. 12 illustrates a maximum drain current density when a drain voltage is 5 V and a gate voltage is 10 V. This transistor is produced by performing bias annealing in air at an annealing temperature of 0° C. to 300° C., with an annealing voltage of +8 V and an annealing time of 300 seconds.

Further, FIG. 12 also illustrates annealing temperature dependency of a maximum drain current in a transistor produced by performing normal annealing with an annealing temperature of 0° C. to 600° C. with an annealing time of 300 seconds in a nitrogen atmosphere. A maximum drain current density in a case where a drain voltage is 5 V and a gate voltage is 10 V is illustrated also for the transistor produced by performing the normal annealing. In FIG. 12, a maximum drain current density of the transistor produced by performing the bias annealing is indicated by a circle, and a maximum drain current density of the transistor produced by performing the normal annealing is indicated by a square. Note that a width and a channel length of the gate electrode 10 of the transistor are the same as those of the above-described transistor.

As illustrated in FIG. 12, in a case of the normal annealing, a maximum drain current (0.35 A/mm) has been obtained at 500° C. Whereas, in a case of the bias annealing, heat treatment at 300° C. or higher cannot be performed due to the configuration of the apparatus, but a higher drain current has been obtained than that of when the normal annealing is performed, in the bias annealing at 250° C. to 300° C.

FIG. 13 is a graph illustrating annealing time dependency of a maximum drain current, in a transistor produced by performing bias annealing in air. In FIG. 13, a vertical axis represents a maximum drain current density [A/mm], and a horizontal axis represents an annealing time [second]. Further, FIG. 13 illustrates a maximum drain current density when a drain voltage is 5 V and a gate voltage is 10 V. This transistor is produced by performing bias annealing in air at an annealing voltage of +8 V, an annealing temperature of 300° C., and an annealing time of 0 seconds to 600 seconds.

Further, FIG. 13 also illustrates a maximum drain current in a transistor produced by performing normal annealing with an annealing temperature of 500° C. and an annealing time of 300 seconds in a nitrogen atmosphere. A maximum drain current density in a case where a drain voltage is 5 V and a gate voltage is 10 V is illustrated also for the transistor produced by performing the normal annealing. In FIG. 13, a maximum drain current density of the transistor produced by performing the bias annealing is indicated by a circle, and a maximum drain current density of the transistor produced by performing the normal annealing is indicated by a square. Note that a width and a channel length of the gate electrode 10 of the transistor are the same as those of the above-described transistor.

According to FIG. 13, it can be seen that when the bias annealing is performed for 60 seconds or more, a drain current higher than that of the normal annealing can be obtained.

In general, an insulated gate metal-oxide-semiconductor field-effect transistor (namely, MOSFET) using Si, GaAs, or SiC is formed with a gate insulating film, for example, an oxide film, on an upper surface of a single-layered semiconductor layer, and is operated with an interface between the semiconductor layer and the oxide film as a channel.

Whereas, in the field effect transistor using the nitride semiconductor according to the present embodiment, the semiconductor layer is joined to the gate insulating film via the barrier layer, and the channel is to be a heterointerface between the barrier layer and the channel layer.

In a case of such a structure, two strong polarization electric fields of piezo polarization and spontaneous polarization, which do not occur in other semiconductors, occur in the barrier layer, and a potential on the gate insulating film side of the barrier layer is raised. Then, a deep trap level that hardly affects the characteristics in a case of a single layer is to be located near the Fermi surface, and greatly affects the characteristics of the semiconductor device.

As a reason why a drain current hardly flows when the heat treatment has not been performed as illustrated in FIG. 8, the influence of a deep level of the interface between the gate oxide film and the barrier layer can be mentioned. Heat treatment at high temperature can be mentioned as one way to reduce a deep trap level, but the drain current has been reduced conversely in the heat treatment at over 600° C. as in a case illustrated in FIG. 12. As a cause of this, it is considered that mutual reaction occurs between not only the interface between the gate insulating film 9a and the barrier layer 4a, but also between bulks thereof, and the trap level in the interface and in the bulk has been increased conversely.

While high temperature annealing has such a limitation, it has been proved from experimental results that the bias annealing according to the present embodiment has a sufficient effect of reducing a deep trap level, even at a low temperature of 250° C. to 300° C.

As described above, the effect of bias annealing can be said to be unique in a structure including a heterojunction made of a nitride semiconductor having a strong polarization electric field.

Note that, even in the bias annealing according to the present embodiment, similarly to the normal annealing at a temperature higher than 600° C., when high-temperature and long-time bias annealing that causes interaction between not only at the interface between the gate insulating film 9a and the barrier layer 4a but also between the bulks thereof is performed, the characteristics may deteriorate conversely.

In the present embodiment, since data of temperature and time beyond that described cannot be obtained due to limitations of the apparatus used in the experiment, no upper limit of temperature and time at the time of bias annealing is provided. However, these upper limits need to be provided such that bias annealing is performed within a range in which the characteristics do not deteriorate.

Further, when a voltage exceeding a breakdown electric field of the gate insulating film 9a is applied to the gate electrode 10, the gate insulating film 9a is broken, and the characteristics deteriorate in this case as well. Therefore, the voltage to be applied to the gate electrode 10 needs to have a value not exceeding the breakdown electric field of the gate insulating film 9a.

Further, in a structure that performs a normally-on operation with a state where energy at a lower end of a conduction band of a heterointerface between the channel layer 3a located below the gate electrode 10 and the barrier layer 4a at that position is lower than the Fermi energy in an equilibrium state, that is, in a state where no voltage is applied to the source electrode 5, the drain electrode 6, and the gate electrode 10, there is a high-concentration two-dimensional electron gas generated at the heterointerface responsible for the drain current.

Therefore, as compared with a structure that performs the normally-off operation with a state where the energy at the lower end of the conduction band of the heterointerface between the channel layer 3a located below the gate electrode 10 and the barrier layer 4a at that position is higher than the Fermi energy, influence of a change in the interface trap level between the barrier layer 4a and the gate insulating film 9 on an amount of the drain current is small.

Therefore, it can be said that the heat treatment after deposition of the gate insulating film 9a and after formation of the gate electrode 10 is more effective for an increase in the drain current, in a structure that performs the normally-off operation with higher energy than the Fermi energy at the lower end of the conduction band of the heterointerface between the channel layer 3a located below the gate electrode 10 and the barrier layer 4a at that position, in an equilibrium state.

Third Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

FIG. 14 is a view schematically illustrating a structure of a semiconductor device according to the present embodiment. Specifically, FIG. 14 is a view schematically illustrating a structure of a heterojunction field effect transistor using a nitride semiconductor according to the present embodiment.

FIG. 1 above illustrates a structure of a transistor actually experimentally produced to have the characteristics illustrated in FIGS. 8 to 13, but the effect of bias annealing after formation of the gate electrode 10 exemplified in the second embodiment is considered to be similarly obtained even in a structure other than the structure of the transistor illustrated in FIG. 1, if the interface between the gate insulating film and the layer made of the nitride semiconductor is formed below the gate electrode 10. Therefore, the structure may be as illustrated in FIG. 14, and does not necessarily have to be the same as the structure illustrated in FIG. 1.

As illustrated in FIG. 14, the heterojunction field effect transistor has a structure in which the channel layer 3a made of GaN and the barrier layer 4a made of AlN in FIG. 1 are respectively changed to a channel layer 3 made of $Al_{x1}In_{y1}Ga_{1-x1-y1}N$ (where $0 \leq x1 \leq 1$, $0 \leq y1 \leq 1$) and a barrier layer 4 made of $Al_{x2}In_{y2}Ga_{1-x2-y2}N$ (where $0 \leq x2 \leq 1$, $0 \leq y2 \leq 1$). Note that the $Al_{x2}In_{y2}Ga_{1-x2-y2}N$ that forms the barrier layer 4 is assumed to have a band gap larger than that of $Al_{x1}In_{y1}Ga_{1-x1-y1}N$ that forms the channel layer 3.

In addition, the heterojunction field effect transistor made of the nitride semiconductor illustrated in FIG. 14 has a structure in which the gate insulating film 9a made of $AlO_a$ in FIG. 1 is changed to a gate insulating film 9 made of an insulator or a semiconductor and having a band gap larger than that of $Al_{x1}In_{y1}Ga_{1-x1-y1}N$, which is a material that forms the barrier layer 4.

Also in such a structure, the structure below the gate electrode 10 is equivalent to the structure illustrated in FIG. 1 of the first embodiment, and it is possible to obtain the effect caused by bias annealing after formation of the gate electrode 10 exemplified in the second embodiment.

The heterojunction field effect transistor having such a structure can be produced by adjusting a flow rate, a pressure, and a temperature (growth conditions) of trimethylindium, trimethylaluminum, trimethylgallium, ammonia, and the like, which are to be raw material gas of $Al_xIn_yGa_{1-x-y}N$ ($0 \leq x \leq 1$, $0 \leq y \leq 1$), so as to achieve a desired composition of a buffer layer 2, the channel layer 3, and the barrier layer 4, at a time of growth of the buffer layer 2, the channel layer 3a, and the barrier layer 4a illustrated in FIG. 2 of the second embodiment.

Fourth Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

FIGS. 15 and 16 are views schematically illustrating a structure of a semiconductor device according to the present embodiment. Specifically, FIGS. 15 and 16 are views schematically illustrating a structure of a heterojunction field effect transistor using a nitride semiconductor according to the present embodiment.

In the heterojunction field effect transistor made of the nitride semiconductor illustrated in FIG. 14, a partial region of an n-type impurity region 7 is formed to overlap with the gate electrode 10 in plan view. Whereas, in a transistor illustrated in FIG. 15, an n-type impurity region 7a does not overlap with a gate electrode 10 in plan view.

Also in such a structure, the structure below the gate electrode 10 is equivalent to the structure exemplified in the first embodiment and the third embodiment, and it is possible to obtain the effect caused by bias annealing after formation of the gate electrode 10 exemplified in the second embodiment.

However, in this case, a region between the n-type impurity region 7a below a source electrode 5 and the gate electrode 10 is to be a high resistance region since there is no carrier. Then, as a formation distance of this region is longer, the resistance becomes higher, while a drain current decreases. Therefore, the structure illustrated in FIG. 14 can obtain a larger drain current than that in the structure illustrated in FIG. 15.

Note that, in the structure illustrated in FIG. 14, the gate electrode 10 has a structure that covers a part of the n-type impurity region 7, and in a case where the n-type impurity region 7 and the gate electrode 10 are overlapped in plan view in this way, parasitic capacitance occurs in a region where the n-type impurity region 7 and the gate electrode 10 are overlapped in plan view. Then, this parasitic capacitance interferes with high frequency operation.

Therefore, it is preferable to minimize the region where the n-type impurity region 7 and the gate electrode 10 are overlapped in plan view, and an optimum structure is, for example, a structure illustrated in FIG. 16, in which an end portion of the gate electrode 10 coincides with an end portion of an n-type impurity region 7b in plan view.

The heterojunction field effect transistor having the structure illustrated in FIG. 15 or FIG. 16 can be produced by changing a mask pattern at a time of the ion implantation illustrated in FIG. 3 of the second embodiment.

Fifth Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

FIGS. 17 and 18 are views schematically illustrating a structure of a semiconductor device according to the present embodiment. Specifically, FIGS. 17 and 18 are views schematically illustrating a structure of a heterojunction field effect transistor using a nitride semiconductor according to the present embodiment.

In the heterojunction field effect transistor made of the nitride semiconductor illustrated in FIG. 14, a partial region of the n-type impurity region 8 is formed to overlap with the gate electrode 10 in plan view. Whereas, in a transistor illustrated in FIG. 17, an n-type impurity region 8a does not overlap with a gate electrode 10 in plan view.

Also in such a structure, the structure below the gate electrode 10 is equivalent to the structure exemplified in the first embodiment, the third embodiment, and the fourth embodiment, and it is possible to obtain the effect caused by bias annealing after formation of the gate electrode 10 exemplified in the second embodiment.

However, in this case, a region between the n-type impurity region 8a below a drain electrode 6 and the gate electrode 10 is to be a high resistance region since there is no carrier. Then, as a formation distance of this region is longer, the resistance becomes higher, while a drain current decreases. Therefore, the structure illustrated in FIG. 14 can obtain a larger drain current than that in the structure illustrated in FIG. 17.

Note that, in the structure illustrated in FIG. 14, the gate electrode 10 has a structure that covers a part of the n-type impurity region 8, and in a case where the n-type impurity region 8 and the gate electrode 10 are overlapped in plan view in this way, parasitic capacitance occurs in a region where the n-type impurity region 8 and the gate electrode 10 are overlapped in plan view. Then, this parasitic capacitance interferes with high frequency operation.

Therefore, it is preferable to minimize the region where the n-type impurity region 8 and the gate electrode 10 are overlapped in plan view, and a desirable structure is, for example, a structure illustrated in FIG. 18, in which an end portion of the gate electrode 10 coincides with an end portion of an n-type impurity region 8b in plan view.

The heterojunction field effect transistor having the structure illustrated in FIG. 17 or FIG. 18 can be produced by changing a mask pattern at a time of the ion implantation illustrated in FIG. 3 of the second embodiment.

Sixth Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

Figure 19:
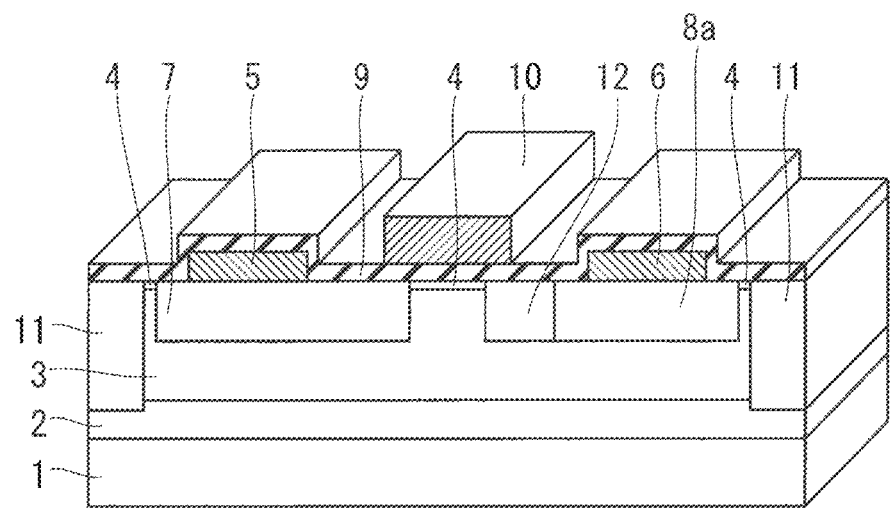
FIG. 19 is a view schematically illustrating a structure of a semiconductor device according to an embodiment.
Figure 20:
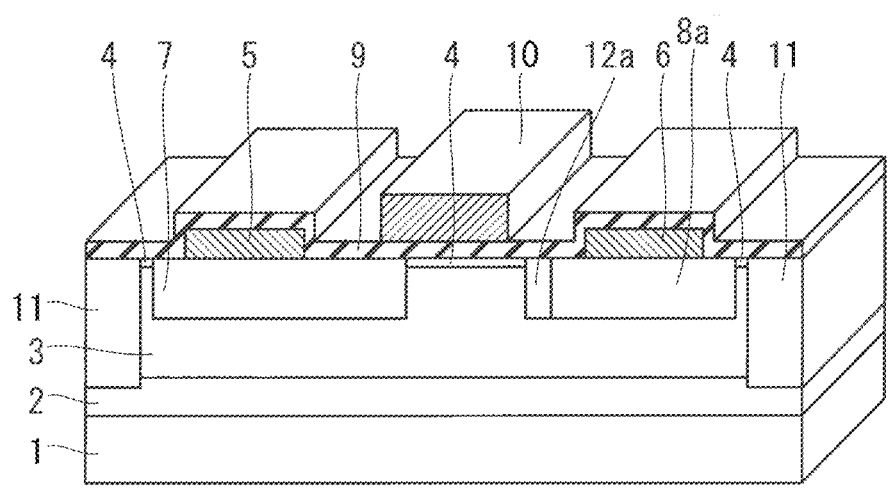
FIG. 20 is a view schematically illustrating a structure of a semiconductor device according to an embodiment.

FIGS. 19, 20, and 21 are views schematically illustrating a structure of a semiconductor device according to the present embodiment. Specifically, FIGS. 19, 20, and 21 are views schematically illustrating a structure of a heterojunction field effect transistor using a nitride semiconductor according to the present embodiment.

The heterojunction field effect transistor made of the nitride semiconductor illustrated in FIGS. 19, 20, and 21 has a structure including a low-concentration n-type impurity region 12 that is formed to be sandwiched between the n-type impurity region 7 and the n-type impurity region 8a in plan view, in the structure illustrated in FIG. 17. The n-type impurity region 12 is formed adjacent to an n-type impurity region 8a. Further, an impurity concentration of the n-type impurity region 12 is lower than an impurity concentration of the n-type impurity region 8a.

By adopting such a structure, when a high voltage is applied to a drain electrode 6, an electric field generated between a gate electrode 10 and the n-type impurity region 8a located below the drain electrode 6 is relaxed. Therefore, a higher voltage can be applied to the drain electrode 6.

Also in such a structure, the structure below the gate electrode 10 is equivalent to the structure exemplified in the first embodiment, the third embodiment, the fourth embodiment, and the fifth embodiment, and it is possible to obtain the effect caused by bias annealing after formation of the gate electrode 10 exemplified in the second embodiment.

Note that, in the structure illustrated in FIG. 20, an n-type impurity region 12a and the gate electrode 10 are not overlapped in plan view. In a case of such a structure, parasitic resistance in a region where the gate electrode 10 and the n-type impurity region 12a are not overlapped increases. Therefore, in order to obtain a sufficiently large drain current, the structure illustrated in FIG. 19 in which the gate electrode 10 and the n-type impurity region 12 are overlapped in plan view is preferable because parasitic resistance can be reduced.

Note that, in the structure illustrated in FIG. 19, the gate electrode 10 is formed so as to partially overlap with the n-type impurity region 12 in plan view, but in a case where the n-type impurity region 12 and the gate electrode 10 are overlapped in plan view, parasitic capacitance occurs in a region where the n-type impurity region 12 and the gate electrode 10 are overlapped in plan view, and interferes with high frequency operation. Therefore, it is preferable to minimize the region where the n-type impurity region 12 and the gate electrode 10 overlap in plan view, and a desirable structure is, for example, a structure illustrated in FIG. 21, in which an end portion of the gate electrode 10 coincides with an end portion of an n-type impurity region 12b in plan view.

The heterojunction field effect transistor having the structure illustrated in FIGS. 19, 20, and 21 can be produced by performing the ion implantation illustrated in FIG. 3 of the second embodiment twice with ion implantation conditions and a mask pattern changed.

Seventh Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

FIG. 22 is a view schematically illustrating a structure of a semiconductor device according to the present embodiment. Specifically, FIG. 22 is a view schematically illustrating a structure of a heterojunction field effect transistor using a nitride semiconductor according to the present embodiment.

As illustrated in FIG. 22, the heterojunction field effect transistor includes a semiconductor substrate 1a made of n-type $Al_{x3}In_{y3}Ga_{1-x3-y3}N$. Then, in the heterojunction field effect transistor, on an upper surface of the semiconductor substrate 1a, there is formed a drift layer 13 made of n-type $Al_{x4}In_{y4}Ga_{1-x4-y4}N$ at a lower concentration than that of the semiconductor substrate 1a. Further, in the heterojunction field effect transistor, on an upper surface of the drift layer 13, a constriction layer 14 made of p-type $Al_{x5}In_{y5}Ga_{1-x5-y5}N$ is formed.

On an upper surface of the constriction layer 14, a channel layer 3 is formed, and a barrier layer 4 is formed further on an upper surface of the channel layer 3.

At a depth reaching inside the channel layer 3 from an upper surface of the barrier layer 4, an n-type impurity region 7c and an n-type impurity region 7d are partially formed individually. Then, on an upper surface of the n-type impurity region 7c and an upper surface of the n-type impurity region 7d, a source electrode 5c and a source electrode 5d are formed respectively.

Further, a drain electrode 6a is formed on a lower surface of the semiconductor substrate 1a. Furthermore, below the source electrode 5c and the source electrode 5d, a p-type impurity region 15c and a p-type impurity region 15d containing an impurity that becomes p-type with respect to a nitride semiconductor are formed respectively, to a depth reaching the constriction layer 14.

Further, in the heterojunction field effect transistor, an n-type impurity region 12c is formed to a depth reaching the drift layer 13 from the barrier layer 4. Further, a gate insulating film 9 and a gate electrode 10c are formed to cover a channel region sandwiched between the n-type impurity region 7c and the n-type impurity region 12c.

In the above-described structure, a drain current flows from the source electrode 5c or the source electrode 5d, through the n-type impurity region 7c or the n-type impurity region 7d, a channel region sandwiched between the n-type impurity region 7c or the n-type impurity region 7d and the n-type impurity region 12c, the n-type impurity region 12c, the drift layer 13, and the semiconductor substrate 1a, to the drain electrode 6a.

Therefore, the above-described structure can be said to be a vertical transistor. By adopting such a vertical transistor structure, arrangement of each component can be devised to increase a drain current per area.

Also in such a vertical transistor, the channel region sandwiched between the n-type impurity region 7c or the n-type impurity region 7d and the n-type impurity region 12c is equivalent to the structure exemplified in the first embodiment, the third embodiment, the fourth embodiment, the fifth embodiment, and the sixth embodiment, and it is possible to obtain the effect caused by bias annealing after formation of the gate electrode 10 exemplified in the second embodiment.

Note that, in the structure illustrated in FIG. 22, a positional relationship between the n-type impurity region 7c or the n-type impurity region 7d and the gate electrode 10c is similar to a positional relationship illustrated in FIG. 14 of the third embodiment, FIG. 15 of the fourth embodiment, and FIG. 16 of the fourth embodiment, a positional relationship between the n-type impurity region 12c and the gate electrode 10c is similar to a positional relationship shown in FIG. 19 of the sixth embodiment, FIG. 20 of the sixth embodiment, and FIG. 21 of the sixth embodiment, and any of these positional relationships may be adopted.

Eighth Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

Figure 23:
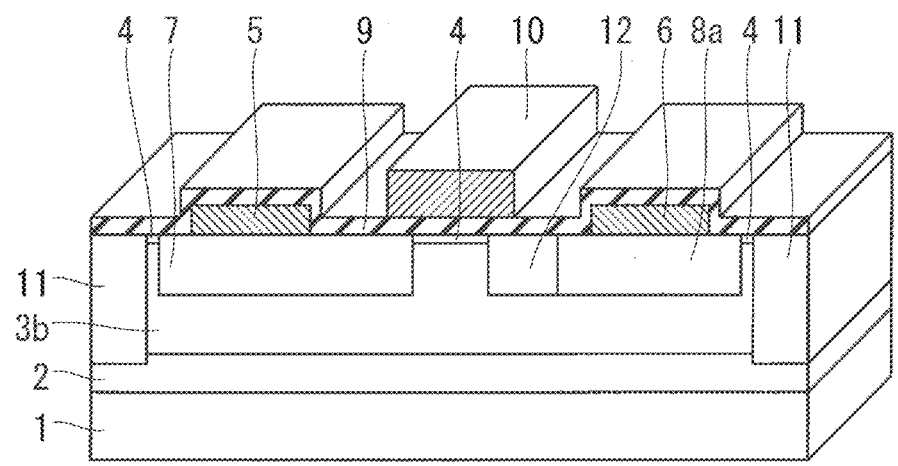
FIG. 23 is a view schematically illustrating a structure of a semiconductor device according to an embodiment.
Figure 24:
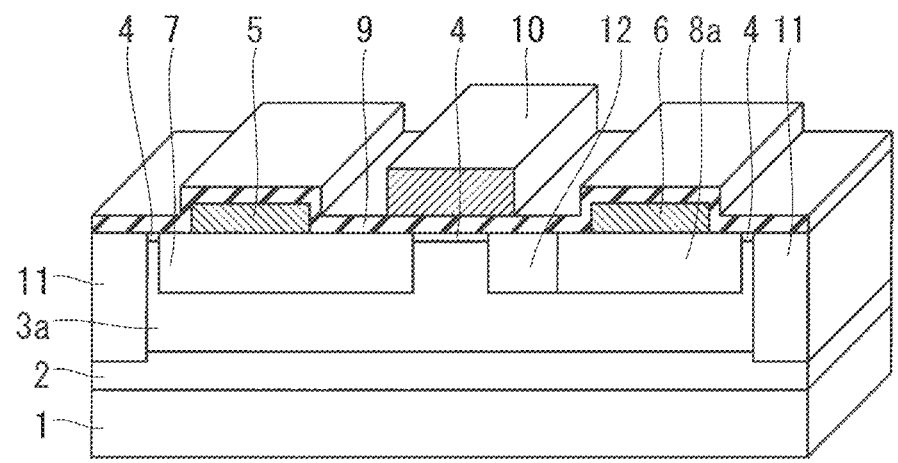
FIG. 24 is a view schematically illustrating a structure of a semiconductor device according to an embodiment.

FIGS. 23 and 24 are views schematically illustrating a structure of a semiconductor device according to the present embodiment. Specifically, FIGS. 23 and 24 are views schematically illustrating a structure of a heterojunction field effect transistor using a nitride semiconductor according to the present embodiment.

As illustrated in FIG. 23, the heterojunction field effect transistor has a structure in which the channel layer 3 made of $Al_{x1}In_{y1}Ga_{1-x1-y1}N$ is changed to a channel layer 3b made of $Al_{x1}Ga_{1-x1}N$ (y1=0), in the structure illustrated in FIG. 19.

By providing the channel layer 3b made of $Al_{x1}Ga_{1-x1}N$ in this way, alloy scattering is suppressed as compared with a case where the channel layer 3 of $Al_{x1}In_{y1}Ga_{1-x1-y1}N$ made of four elements is provided. Therefore, mobility of electrons in a channel formed at a heterointerface can be improved, and a drain current can be increased.

Furthermore, if a material having a relatively large Al composition (x1) is used for the channel layer 3b, a band gap is increased. Therefore, resistance to high voltage is improved, and high voltage operation becomes possible.

Furthermore, a heterojunction field effect transistor made of the nitride semiconductor illustrated in FIG. 24 has a structure in which the channel layer 3b made of $Al_{x1}Ga_{1-x1}N$ illustrated in FIG. 23 is changed to a channel layer 3a made of GaN (x1=0, y1=0).

By providing the channel layer 3a made of GaN in this way, alloy scattering is further suppressed as compared with the channel layer 3b of $Al_{x1}Ga_{1-x1}N$ made of three elements. Therefore, mobility of electrons in a channel formed at a heterointerface can be further improved, and a drain current can be further increased.

Furthermore, since crystal growth can be facilitated, and impurities unintentionally mixed in the channel layer 3a can be reduced, it becomes possible to suppress current collapse caused by an electron trap due to these impurities.

Note that, in the present embodiment, the materials that form the channel layer 3a and the channel layer 3b have been mentioned so as to compare the structure illustrated in FIG. 19 with the structure illustrated in FIG. 23 and the structure illustrated in FIG. 24, but the effects caused by the present embodiment cover all the structures illustrated in FIGS. 1, 2 to 7, 14, 15, 16, 17, 18, 19, to 21, and 22.

The heterojunction field effect transistor having the structure illustrated in FIGS. 23 and 24 can be produced by adjusting a flow rate or a pressure, and a temperature (growth conditions) of trimethylindium, trimethylaluminum, trimethylgallium, ammonia, and the like, which are to be raw material gas of $Al_xIn_yGa_{1-x-y}N$ (0≤x≤1, 0≤y≤1), so as to achieve a desired composition of the channel layer 3, at a time of growth of the channel layer 3 illustrated in FIG. 2 of the second embodiment.

Ninth Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

Figure 25:
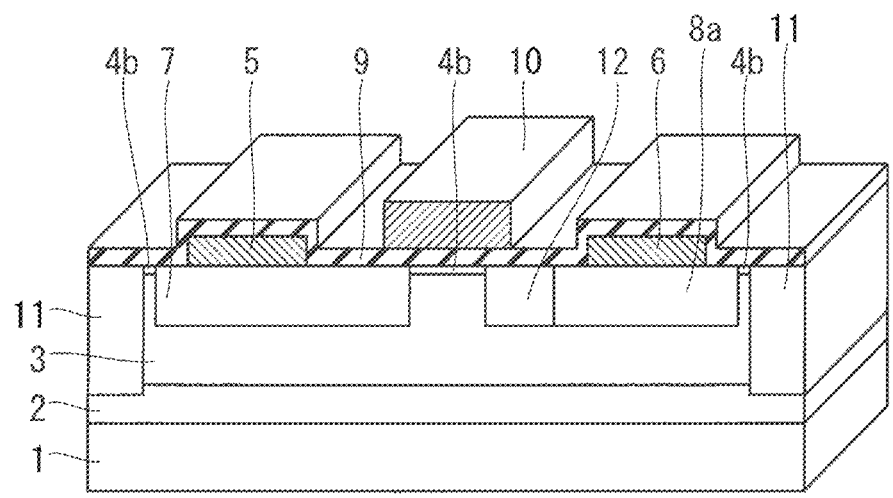
FIG. 25 is a view schematically illustrating a structure of a semiconductor device according to an embodiment.
Figure 26:
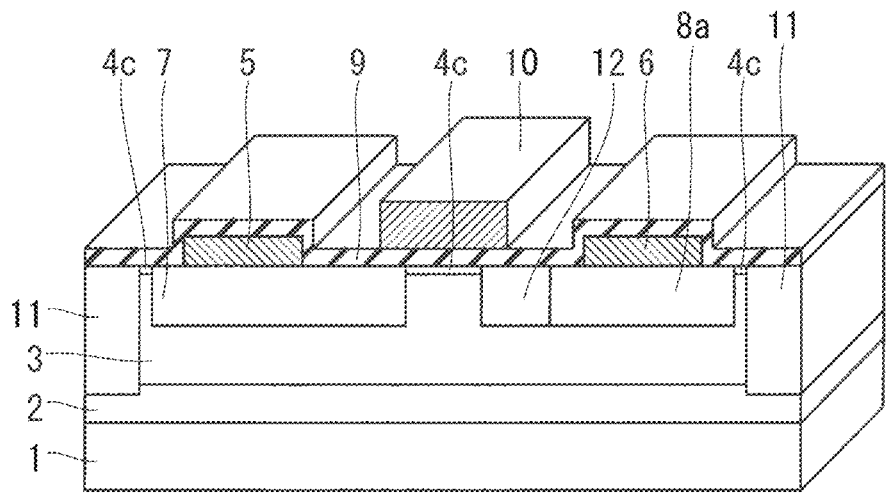
FIG. 26 is a view schematically illustrating a structure of a semiconductor device according to an embodiment.
Figure 27:
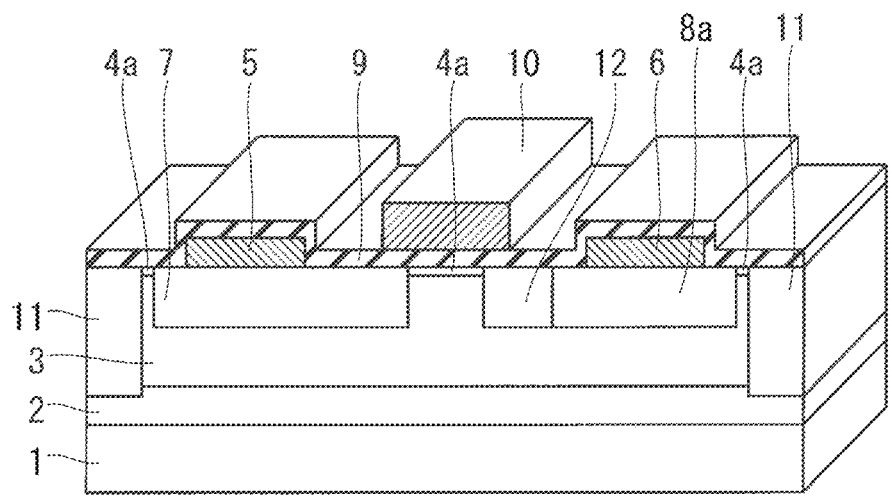
FIG. 27 is a view schematically illustrating a structure of a semiconductor device according to an embodiment.

FIGS. 25, 26, and 27 are views schematically illustrating a structure of a semiconductor device according to the present embodiment. Specifically, FIGS. 25, 26, and 27 are views schematically illustrating a structure of a heterojunction field effect transistor using a nitride semiconductor according to the present embodiment.

As illustrated in FIG. 25, the heterojunction field effect transistor has a structure in which the barrier layer 4 made of $Al_{x2}In_{y2}Ga_{1-x2-y2}N$ illustrated in FIG. 19 is changed to a barrier layer 4b made of $Al_{x2}Ga_{1-x2}N$ (y2=0, for example, AlGaN).

By providing the barrier layer 4b made of $Al_{x2}Ga_{1-x2}N$ in this way, alloy scattering received by electrons traveling as carriers at a heterointerface between a channel layer 3 and the barrier layer 4b is reduced. Therefore, mobility of electrons can be improved, and a drain current can be increased.

Further, the heterojunction field effect transistor made of the nitride semiconductor illustrated in FIG. 26 has a structure in which the barrier layer 4 made of $Al_{x2}In_{y2}Ga_{1-x2-y2}N$ illustrated in FIG. 19 is changed to a barrier layer 4c made of $In_{y2}Al_{y2}N$ (x2+y2=1).

By providing the barrier layer 4c made of $In_{y2}Al_{y2}N$ in this way, alloy scattering received by electrons traveling as carriers at a heterointerface between the channel layer 3 and the barrier layer 4c is reduced. Therefore, mobility of electrons can be improved, and a drain current can be increased.

Furthermore, the heterojunction field effect transistor made of the nitride semiconductor illustrated in FIG. 27 has a structure in which the barrier layer 4 made of $Al_{x2}In_{y2}Ga_{1-x2-y2}N$ illustrated in FIG. 19 is changed to a barrier layer 4a made of AlN (x2=0, y2=0).

By providing the barrier layer 4a made of AlN in this way, alloy scattering received by electrons traveling as carriers at a heterointerface between the channel layer 3 and the barrier layer 4a is further reduced. Therefore, mobility of electrons can be further improved, and a drain current can be further increased.

Note that, in the present embodiment, materials that form the barrier layer 4a, the barrier layer 4b, and the barrier layer 4c have been mentioned so as to compare the structure illustrated in FIG. 19 with the structure illustrated in FIG. 25, the structure illustrated in FIG. 26, and the structure illustrated in FIG. 27, but the effects caused by the present embodiment cover all the structure illustrated in FIGS. 1, 2 to 7, 14, 15, 16, 17, 18, 19 to 21, 22, 23, and 24.

The heterojunction field effect transistor having the structure illustrated in FIGS. 25, 26, and 27 can be produced by adjusting a flow rate or a pressure, and a temperature (growth conditions) of trimethylindium, trimethylaluminum, trimethylgallium, ammonia, and the like, which are to be raw material gas of $Al_xIn_yGa_{1-x-y}N$ (0≤x≤1, 0≤y≤1), so as to achieve a desired composition of the barrier layer 4, at a time of growth of the barrier layer 4 illustrated in FIG. 2 of the second embodiment.

Tenth Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

Figure 28:
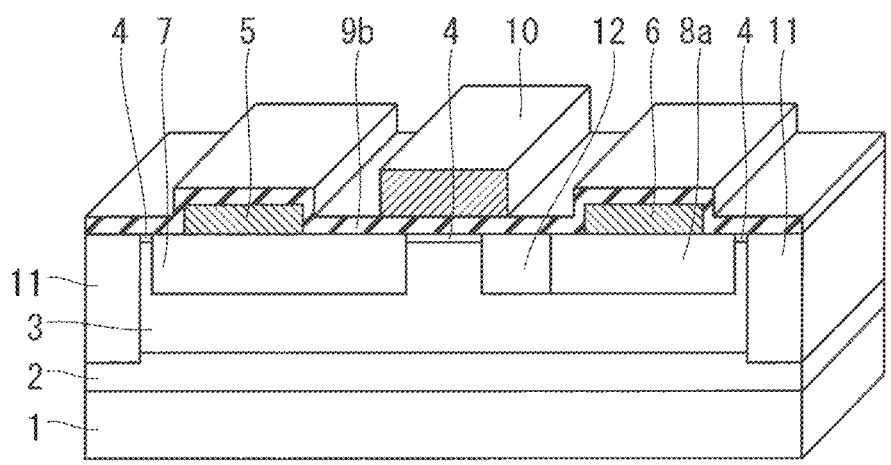
FIG. 28 is a view schematically illustrating a structure of a semiconductor device according to an embodiment.

FIGS. 28, 29, and 30 are views schematically illustrating a structure of a semiconductor device according to the present embodiment. Specifically, FIGS. 28, 29, and 30 are views schematically illustrating a structure of a heterojunction field effect transistor using a nitride semiconductor according to the present embodiment.

As illustrated in FIG. 28, the heterojunction field effect transistor has a structure in which the gate insulating film 9 made of an insulator or a semiconductor and having a band gap larger than that of $Al_{x1}In_{y1}Ga_{1-x1-y1}N$ illustrated in FIG. 19 is changed to a gate insulating film 9b made of $AlGa_cO_aN_b$.

$AlGa_cO_aN_b$ is the same as a constituent element of a semiconductor that forms a barrier layer 4 except oxygen.

Therefore, as compared with a material such as $SiO_2$ having a different constituent element, it is easy to reduce an interface trap level generated at an interface between the barrier layer 4 and the gate insulating film 9b, and easy to obtain a large drain current.

Furthermore, the heterojunction field effect transistor made of the nitride semiconductor illustrated in FIG. 29 has a structure in which the gate insulating film 9b made of $AlGa_cO_aN_b$ illustrated in FIG. 28 is changed to a gate insulating film 9c made of $AlO_aN_b$.

$AlO_aN_b$ has a larger band gap than that of $AlGa_cO_aN_b$. Therefore, by adopting such a structure, a large positive voltage can be applied to a gate electrode, and a larger drain current can be obtained.

Furthermore, the heterojunction field effect transistor made of nitride semiconductor illustrated in FIG. 30 has a structure in which the gate insulating film 9c made of $AlO_aN_b$ illustrated in FIG. 29 is changed to a gate insulating film 9a made of $AlO_a$ (for example, AlO).

$AlO_a$ has an even larger band gap than that of $AlO_aN_b$. Therefore, by adopting such a structure, an even larger positive voltage can be applied to the gate electrode 10, and an even larger drain current can be obtained.

Note that, in the present embodiment, materials that form the gate insulating film 9a, the gate insulating film 9b, and the gate insulating film 9c have been mentioned so as to compare the structure illustrated in FIG. 19 with the structures illustrated in FIGS. 28, 29, and 30, but the effects caused by the present embodiment cover all the structure illustrated in FIGS. 1, 2 to 7, 14, 15, 16, 17, 18, 19 to 21, 22, 23, 24, 25 to 27.

The heterojunction field effect transistor having the structure illustrated in FIGS. 28, 29, and 30 can be produced by adjusting a flow rate or a pressure, and a temperature (growth conditions) of trimethylaluminum, trimethylgallium, oxygen, ozone, nitrogen, and the like, which are to be raw material gas for the gate insulating film, so as to achieve a desired composition of the gate insulating film 9a, at the time of deposition of the gate insulating film 9 illustrated in FIG. 6 of the second embodiment.

Eleventh Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

FIG. 31 is a view schematically illustrating a structure of a semiconductor device according to the present embodiment. Specifically, FIG. 31 is a view schematically illustrating a structure of a heterojunction field effect transistor using a nitride semiconductor according to the present embodiment.

As illustrated in FIG. 31, the heterojunction field effect transistor has a structure in which the barrier layer 4 made of $Al_{x2}In_{y2}Ga_{1-x2-y2}N$ in the structure illustrated in FIG. 19 is not formed.

Even in a case where the barrier layer 4 is not formed in this way, a normally-off operation is realized as long as electrons are not generated at an interface between a channel layer 3 and a gate insulating film 9 in an equilibrium state, and a sufficiently large drain current can be obtained as long as an interface trap level between the channel layer 3 and the gate insulating film 9 is sufficiently low.

Also in such a structure, since an interface trap level is considered to be formed between the channel layer 3 and the gate insulating film 9, it is considered that the effect of the heat treatment after deposition of the gate insulating film 9 and after formation of the gate electrode 10 exemplified in the second embodiment can be obtained.

However, in the above-described structure, it is concerned that mobility is lowered and a drain current is decreased as compared with a case where the barrier layer 4 made of $Al_{x2}In_{y2}Ga_{1-x2-y2}N$ is formed.

Therefore, it can be said that, in the structure illustrated in FIGS. 1, 2 to 7, 14, 15, 16, 17, 18, 19 to 21, 22, 23, 24, 25 to 27, and 28 to 30 in which the barrier layer 4, the barrier layer 4a, or the barrier layer 4b is formed, a large drain current can be easily obtained, and the structure is suitable.

Note that, in the present embodiment, the structure of the barrier layer 4 has been mentioned so as to compare the structure illustrated in FIG. 19 with the structure illustrated in FIG. 31, but the effects caused by the present embodiment cover all the structure illustrated in FIGS. 1, 2 to 7, 14, 15, 16, 17, 18, 19 to 21, 22, 23, 24, 25 to 27, and 28 to 30.

The heterojunction field effect transistor having the structure illustrated in FIG. 31 can be produced if the barrier layer 4a illustrated in FIG. 2 of the second embodiment is not to be grown.

Twelfth Embodiment

A semiconductor device and a method for manufacturing semiconductor device according to the present embodiment will be described. In the following description, configurations similar to the configurations described in the above-described embodiment are given with same reference numerals, and the detailed description thereof is appropriately omitted.

<Regarding Configuration of Semiconductor Device>

FIG. 32 is a view schematically illustrating a structure of a semiconductor device according to the present embodiment. Specifically, FIG. 32 is a view schematically illustrating a structure of a heterojunction field effect transistor using a nitride semiconductor according to the present embodiment.

The field effect transistor made of the nitride semiconductor exemplified in the first to eleventh embodiments described above is described with only the structure of interest in each embodiment being extracted, but may have a structure as exemplified below as long as it operates as a transistor, and is not necessarily to have a same structure as exemplified in the first to eleventh embodiments.

In a case of using SiC or Si different from a channel layer as a semiconductor substrate, a buffer layer 2 is required, but in a case of using GaN, AlGaN, or InAlGaN of the same material as the channel layer as the semiconductor substrate, the buffer layer 2 is not necessarily required. Further, the buffer layer 2 does not necessarily have to be non-doped. However, in a case of adopting the vertical structure exemplified in the seventh embodiment, it is desirable that the semiconductor substrate be n-type.

Further, if three layers of a channel layer, a barrier layer, and a gate insulating film have been formed on a semiconductor substrate, a channel for operating the transistor is formed at an interface between the channel layer and the barrier layer, and operation as a transistor is achieved. In the above embodiments, only minimal semiconductor layers to operate as a transistor is described, but a plurality of other layers may be formed in addition to the above three layers, as long as operation as a transistor is achieved.

For example, a nitride semiconductor layer having a composition different from that of the channel layer 3 or the barrier layer 4 may be formed below the channel layer 3. Further, these nitride semiconductor layers including the channel layer 3 or the barrier layer 4 do not necessarily have to be non-doped, but may contain an impurity such as Si, Mg, Fe, C, or Ge of an amount that does not hinder the transistor operation.

Further, in the above embodiments, the gate insulating film has a structure deposited on the entire surface of the semiconductor device, but does not necessarily have a structure deposited on the entire surface, but may have a structure in which the gate insulating film 9d is not deposited between the gate electrode 10 and the source electrode 5 or between the gate electrode 10 and the drain electrode 6 as illustrated in FIG. 32, since the effect described above can be obtained as long as it is formed at least between the barrier layer 4 and the gate electrode 10.

<Regarding Effect Caused by Embodiments Described Above>

Next, effects caused by the embodiments described above are exemplified. Note that, in the following description, these effects are described on the basis of a specific configuration exemplified in the embodiments described above, but replacement may be made with another specific configuration exemplified in this specification in a range where similar effects occur.

Further, this replacement may be performed across multiple embodiments. That is, it may be a case where individual configurations illustrated in different embodiments are combined to exhibit similar effects.

Further, the structures exemplified in the first to the eleventh embodiments are not to necessarily be independent structures individually, but may have a structure being combined.

According to the embodiment described above, in the method for manufacturing semiconductor device, the channel layer 3 that is $Al_{x1}In_{y1}Ga_{1-x1-y1}N$ (where $0 \leq x1 \leq 1$, $0 \leq y1 \leq 1$) is formed on the upper surface of the semiconductor substrate 1. Then, on the upper surface of the channel layer 3, the barrier layer 4 that is $Al_{x2}In_{y2}Ga_{1-x2-y2}N$ (where $0 \leq x2 \leq 1$, $0 \leq y2 \leq 1$) having a band gap larger than a band gap of the channel layer 3 is formed. Then, on the upper surface of the barrier layer 4, the gate insulating film 9 that is an insulator or a semiconductor and has a band gap larger than that of the barrier layer 4 is at least partially formed. Then, on the upper surface of the gate insulating film 9, the gate electrode 10 is formed. Then, heat treatment is performed while a positive voltage is applied to the gate electrode 10.

According to such a configuration, an interface trap level formed between the barrier layer 4 and the gate insulating film 9 is reduced by performing bias annealing on the gate electrode 10. Therefore, a sufficiently large drain current can be obtained in a field effect transistor using a nitride semiconductor.

Note that, other configurations exemplified in this specification other than these structures may be omitted as needed. That is, as long as at least these configurations are provided, the effects described above can be produced.

However, in a case where at least one of the other configurations exemplified in this specification is appropriately added to the configuration described above, that is, even in a case where another configuration exemplified in this specification that has not been described as the configuration described above is added to the configuration described above, the effects described above can similarly be produced.

In addition, when there is no particular limitation, the order for performing each process can be changed.

Further, according to the embodiment described above, a plurality of first impurity regions reaching the channel layer 3 from the upper surface of the barrier layer 4 are formed. Here, the first impurity region corresponds to at least one of, for example, the n-type impurity region 7, the n-type impurity region 7a, the n-type impurity region 7b, the n-type impurity region 7c, the n-type impurity region 7d, the n-type impurity region 8, the n-type impurity region 8a, and the n-type impurity region 8b. Then, the gate insulating film 9 is formed at least on the upper surface of the barrier layer 4 sandwiched between the n-type impurity region 7 and the n-type impurity region 8a in plan view. According to such a configuration, an interface trap level formed between the barrier layer 4 and the gate insulating film 9 is reduced by performing bias annealing on the gate electrode 10. Therefore, a sufficiently large drain current can be obtained.

Further, according to the embodiment described above, the gate electrode 10 is formed on the upper surface of the gate insulating film 9, in a range not overlapping with the n-type impurity region 7a in plan view. Further, according to the embodiment described above, the gate electrode 10 is formed on the upper surface of the gate insulating film 9, in a range not overlapping with the n-type impurity region 8a in plan view. According to such a configuration, parasitic capacitance generated in a region where the impurity region and the gate electrode 10 are overlapped in plan view can be suppressed.

Further, according to the embodiment described above, the gate electrode 10 is formed on the upper surface of the gate insulating film 9, in a range where the end portion coincides with the n-type impurity region 7b in plan view. Further, according to the embodiment described above, the gate electrode 10 is formed on the upper surface of the gate insulating film 9, in a range where the end portion coincides with the n-type impurity region 8b in plan view. According to such a configuration, it is possible to suppress both of parasitic capacitance generated in a region where the impurity region and the gate electrode 10 are overlapped in plan view and resistance generated by the region between the impurity region and the gate electrode 10.

Further, according to the embodiment described above, there is formed the second impurity region reaching the channel layer 3 from the upper surface of the barrier layer 4 and being sandwiched between the n-type impurity region 7c and the n-type impurity region 7d in plan view. Here, the second impurity region corresponds to, for example, at least one of the n-type impurity region 12, the n-type impurity region 12a, the n-type impurity region 12b, and the n-type impurity region 12c. An impurity concentration of the n-type impurity region 12c is lower than an impurity concentration of the n-type impurity region 7c and an impurity concentration of the n-type impurity region 7d. According to such a configuration, when a high voltage is applied to the drain electrode 6, an electric field generated between the gate electrode 10 and the n-type impurity region 8a located below the drain electrode 6 is relaxed. Therefore, a higher voltage can be applied to the drain electrode 6.

According to the embodiment described above, the n-type impurity region 12 is formed at a position adjacent to the n-type impurity region 8a. According to such a configuration, when a high voltage is applied to the drain electrode 6, an electric field generated between the gate electrode 10 and the n-type impurity region 8a located below the drain electrode 6 is effectively relaxed. Therefore, a higher voltage can be applied to the drain electrode 6.

Further, according to the embodiment described above, heat treatment is performed at a temperature of 250° C. or more for 60 seconds or more while +5 V is applied as a positive voltage to the gate electrode 10. According to such a configuration, since an interface trap level formed between the barrier layer 4a and the gate insulating film 9a is reduced, a sufficiently large drain current can be obtained.

Further, according to the embodiment described above, heat treatment is performed in an atmosphere having an oxygen concentration of 20% or more, while a positive voltage is applied to the gate electrode 10. According to such a configuration, during bias annealing hydrogen that forms a trap level is reduced, and a drain current can be increased.

Further, according to the embodiment described above, in a state where no voltage applied to the gate electrode 10, energy at the lower end of the conduction band at the heterointerface between the channel layer 3a and the barrier layer 4a located below the gate electrode 10 is higher than the Fermi energy. According to such a configuration, two-dimensional electron gas is not generated at the heterointerface between the channel layer 3a and the barrier layer 4a. Therefore, the transistor can be made to perform the normally-off operation.

Further, according to the embodiment described above, the channel layer 3a that is GaN is formed on the upper surface of the semiconductor substrate 1. According to such a configuration, alloy scattering is suppressed as compared with the channel layer 3b of $Al_{x1}Ga_{1-x1}N$ made of three elements. Therefore, mobility of electrons in a channel formed at a heterointerface can be improved, and a drain current can be increased.

Further, according to the embodiment described above, the barrier layer 4b that is AlGaN is formed on the upper surface of the channel layer 3. According to such a configuration, alloy scattering received by electrons traveling as carriers at the heterointerface between the channel layer 3 and the barrier layer 4b is reduced. Therefore, mobility of electrons can be improved, and a drain current can be increased.

Further, according to the embodiment described above, the barrier layer 4c that is InAlN is formed on the upper surface of the channel layer 3. According to such a configuration, alloy scattering received by electrons traveling as carriers at the heterointerface between the channel layer 3 and the barrier layer 4c is reduced. Therefore, mobility of electrons can be improved, and a drain current can be increased.

Further, according to the embodiment described above, the barrier layer 4a that is AlN is formed on the upper surface of the channel layer 3. According to such a configuration, alloy scattering received by electrons traveling as carriers at the heterointerface between the channel layer 3 and the barrier layer 4a is reduced. Therefore, mobility of electrons can be improved, and a drain current can be increased.

Further, according to the embodiment described above, the gate insulating film 9a that is AlO is at least partially formed on the upper surface of the barrier layer 4. According to such a configuration, since the band gap of AlO is relatively large, a large positive voltage can be applied to the gate electrode 10. Therefore, a large drain current can be obtained.

Further, according to the embodiment described above, in the method for manufacturing semiconductor device, the channel layer 3 that is $Al_{x1}In_{y1}Ga_{1-x1-y1}N$ (where $0 \leq x1 \leq 1$, $0 \leq y1 \leq 1$) is formed on the upper surface of the semiconductor substrate 1. Then, the gate insulating film 9 that is an insulator or a semiconductor and has a band gap larger than a band gap of the channel layer 3 is at least partially formed on the upper surface of the channel layer 3. Then, on the upper surface of the gate insulating film 9, the gate electrode 10 is formed. Then, heat treatment is performed while a positive voltage is applied to the gate electrode 10. According to such a configuration, an interface trap level formed between the channel layer 3 and the gate insulating film 9 is reduced by performing bias annealing on the gate electrode 10. Therefore, a sufficiently large drain current can be obtained.

<Regarding Modification of Embodiments Described Above>

An n-type impurity for doping the n-type impurity region 7, the n-type impurity region 7a, the n-type impurity region 7b, the n-type impurity region 7c, the n-type impurity region 7d, the n-type impurity region 8, the n-type impurity region 8a, the n-type impurity region 8b, the n-type impurity region 12, the n-type impurity region 12a, the n-type impurity region 12b, the n-type impurity region 12c, the drift layer 13, or the semiconductor substrate 1a, may be any impurity that acts as an n-type dopant in a nitride semiconductor, such as Si, Ge, oxygen, nitrogen, or a vacancy.

Further, a p-type impurity for doping the p-type impurity region 15c, the p-type impurity region 15d, or the constriction layer 14 may be an impurity that acts as a p-type dopant in a nitride semiconductor, such as Mg or Fe.

Further, the gate insulating film 9, the gate insulating film 9a, the gate insulating film 9b, the gate insulating film 9c, or the gate insulating film 9d is not necessarily made of a single layer, but may be made of a plurality of layers such as $AlGa_cO_aN_b$, $AlO_aN_b$, $AlO_a$, $SiO_2$, or $Si_3N_4$.

Further, in the above embodiment, only the minimal elements required to operate as a transistor are described, but usage as a device is achieved in a structure formed with a protective film, a field plate electrode, wiring, an air bridge, or a via hole, at the end.

Further, in the embodiments described above, material qualities, materials, dimensions, shapes, relative arrangement relationships, or implementation conditions of individual components may also be described, but these are illustrative in all respects and are not limited to those described in this specification.

Accordingly, numerous modifications not illustrated and equivalents are assumed within the scope of the technology disclosed in this specification. For example, a case of deforming at least one component, a case of adding or omitting, and further, a case of extracting at least one component in at least one embodiment and combining with a component of another embodiment, are to be included.

In addition, unless contradiction arises, a component described as being included as "one" in the embodiments described above may be included as "one or more".

Furthermore, each component in the embodiments described above is a conceptual unit, and the scope of the technology disclosed in this specification includes: a case where one component is made of a plurality of structures; a case where one component corresponds to a part of a structure; and further, a case where a plurality of components are provided in one structure.

Further, each component in the embodiments described above includes a structure having another structure or shape as long as the same function is exhibited.

In addition, the description in this specification is referred to for all purposes related to the present technology, and none is recognized as prior art.

Moreover, in the embodiments described above, when a material name and the like are described without being specified, it is considered that this material contains other additives, such as an alloy, unless contradiction arises.

EXPLANATION OF REFERENCE SIGNS 1, 1a: semiconductor substrate
2: buffer layer
3, 3a, 3b: channel layer
4, 4a, 4b, 4c: barrier layer
5, 5c, 5d: source electrode
6, 6a: drain electrode
7, 7a, 7b, 7c, 7d, 8, 8a, 8b, 12, 12a, 12b, 12c: n-type impurity region
9, 9a, 9b, 9c, 9d: gate insulating film
10, 10c: gate electrode
11: element isolation region
13: drift layer
14: constriction layer
15c, 15d: p-type impurity region

The invention claimed is:

1. A method for manufacturing semiconductor device comprising:
   forming a channel layer that is $Al_{x1}In_{y1}Ga_{1-x1-y1}N$ (where $0 \leq x1 \leq 1$, $0 \leq y1 \leq 1$) on an upper surface of a semiconductor substrate;
   forming a barrier layer that is $Al_{x2}In_{y2}Ga_{1-x2-y2}N$ (where $0 \leq x2 \leq 1$, $0 \leq y2 \leq 1$) having a band gap larger than a band gap of the channel layer on an upper surface of the channel layer;
   at least partially forming a gate insulating film that is an insulator or a semiconductor and has a band gap larger than that of the barrier layer, on an upper surface of the barrier layer;
   forming a gate electrode on an upper surface of the gate insulating film; and
   performing heat treatment while applying a positive voltage to the gate electrode.

2. The method for manufacturing semiconductor device according to claim 1, further comprising
   forming a plurality of first impurity regions reaching the channel layer from the upper surface of the barrier layer, wherein
   the forming the gate insulating film is forming the gate insulating film at least on the upper surface of the barrier layer between the first impurity regions in plan view.

3. The method for manufacturing semiconductor device according to claim 2, wherein
   the forming the gate electrode is forming the gate electrode on the upper surface of the gate insulating film, in a range not overlapping with the first impurity region in plan view.

4. The method for manufacturing semiconductor device according to claim 2, wherein
   the forming the gate electrode is forming the gate electrode on the upper surface of the gate insulating film, in a range where an end portion of the gate electrode coincides with the first impurity region in plan view.

5. The method for manufacturing semiconductor device according to claim 2, further comprising
forming a second impurity region reaching the channel layer from the upper surface of the barrier layer and being sandwiched between the first impurity regions in plan view, wherein
an impurity concentration of the second impurity region is lower than an impurity concentration of the first impurity region.

6. The method for manufacturing semiconductor device according to claim 5, wherein
the forming the second impurity region is forming the second impurity region at a position adjacent to the first impurity region.

7. The method for manufacturing semiconductor device according to claim 1, wherein
the performing the heat treatment is performing the heat treatment at a temperature of 250° C. or more for 60 seconds or more while applying +5 V as a positive voltage to the gate electrode.

8. The method for manufacturing semiconductor device according to claim 1, wherein
the performing the heat treatment is performing the heat treatment in an atmosphere having an oxygen concentration of 20% or more while applying a positive voltage to the gate electrode.

9. The method for manufacturing semiconductor device according to claim 1, wherein
in a state where no voltage is applied to the gate electrode, energy at a lower end of a conduction band at a heterointerface between the channel layer and the barrier layer located below the gate electrode is higher than Fermi energy.

10. The method for manufacturing semiconductor device according to claim 1, wherein
the forming the channel layer is forming the channel layer that is GaN on the upper surface of the semiconductor substrate.

11. The method for manufacturing semiconductor device according to claim 1, wherein
the forming the barrier layer is forming the barrier layer that is AlGaN on the upper surface of the channel layer.

12. The method for manufacturing semiconductor device according to claim 1, wherein
the forming the barrier layer is forming the barrier layer that is InAlN on the upper surface of the channel layer.

13. The method for manufacturing semiconductor device according to claim 1, wherein
the forming the barrier layer is forming the barrier layer that is AlN on the upper surface of the channel layer.

14. The method for manufacturing semiconductor device according to claim 1, wherein
the forming the gate insulating film is at least partially forming the gate insulating film that is AlO on the upper surface of the barrier layer.

15. A method for manufacturing semiconductor device comprising:
forming a channel layer that is $Al_{x1}In_{y1}Ga_{1-x1-y1}N$ (where $0 \leq x1 \leq 1$, $0 \leq y1 \leq 1$) on an upper surface of a semiconductor substrate;
at least partially forming a gate insulating film that is an insulator or a semiconductor and has a band gap larger than a band gap of the channel layer on an upper surface of the channel layer;
forming a gate electrode on an upper surface of the gate insulating film; and
performing heat treatment while applying a positive voltage to the gate electrode.

16. The method for manufacturing semiconductor device according to claim 1, wherein
the applying the positive voltage and the heat treatment are performed in a process different from a heat treatment in formation of a nitride semiconductor and an application of a voltage in evaluation of performance of the nitride semiconductor.

17. The method for manufacturing semiconductor device according to claim 7, wherein
the heat treatment is performed at a temperature of 600° C. or lower.

* * * * *